US011088294B2

(12) United States Patent
Sun et al.

(10) Patent No.: US 11,088,294 B2
(45) Date of Patent: Aug. 10, 2021

(54) PHOTOVOLTAIC CELL ASSEMBLY, PHOTOVOLTAIC CELL ARRAY, AND SOLAR CELL ASSEMBLY

(71) Applicant: BYD COMPANY LIMITED, Shenzhen (CN)

(72) Inventors: Xiang Sun, Shenzhen (CN); Yunjiang Yao, Shenzhen (CN); Ye Tian, Shenzhen (CN); Bei Fan, Shenzhen (CN); Zhanfeng Jiang, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 64 days.

(21) Appl. No.: 16/309,693

(22) PCT Filed: Jun. 23, 2017

(86) PCT No.: PCT/CN2017/089820
§ 371 (c)(1),
(2) Date: Dec. 13, 2018

(87) PCT Pub. No.: WO2018/001188
PCT Pub. Date: Jan. 4, 2018

(65) Prior Publication Data
US 2019/0140124 A1 May 9, 2019

(30) Foreign Application Priority Data

Jun. 30, 2016 (CN) .................. 201610510202.X
Jun. 30, 2016 (CN) .................. 201620686961.7

(51) Int. Cl.
*H01L 31/05* (2014.01)
*H01L 31/0352* (2006.01)
(Continued)

(52) U.S. Cl.
CPC .. *H01L 31/0504* (2013.01); *H01L 31/022425* (2013.01); *H01L 31/022441* (2013.01); (Continued)

(58) Field of Classification Search
CPC ..... H01L 31/022441; H01L 31/022458; H01L 31/02008; H01L 31/0201; H01L 31/0516
See application file for complete search history.

(56) References Cited

U.S. PATENT DOCUMENTS 5,017,243 A 5/1991 Otsubo
2015/0380591 A1* 12/2015 Bett .................... H01L 31/0687
136/255
2018/0114873 A1* 4/2018 Koizumi ............. H01L 31/0224

FOREIGN PATENT DOCUMENTS

| CN | 102201460 A | 9/2011 |
| CN | 103117313 A | 5/2013 |
| CN | 103943704 A | 7/2014 |
| CN | 104064609 A | 9/2014 |
| CN | 104465892 A | 3/2015 |
| CN | 104576798 A | 4/2015 |

(Continued)

OTHER PUBLICATIONS

The World Intellectual Property Organization (WIPO) International Search Report for PCT/CN2017/089820 dated Sep. 27, 2017, 6 Pages.

*Primary Examiner* — Magali P Slawski
(74) *Attorney, Agent, or Firm* — Anova Law Group, PLLC

(57) ABSTRACT

The disclosure discloses a photovoltaic cell assembly, a photovoltaic cell array, and a solar cell assembly. The photovoltaic cell assembly includes: a plurality of photovoltaic cells arranged sequentially along a longitudinal direction, and at least one conductive band, where each photovoltaic cell includes a silicon wafer, a front conductive member disposed on a front surface of the silicon wafer, two electrodes disposed on a back surface of the silicon wafer, and a side conductive member that is disposed on a side surface of the silicon wafer and that is electrically connected (Continued)

between the front conductive member and one electrode, where the two electrodes extend along a transverse direction and are distributed at an interval in the longitudinal direction; and the conductive band has an extension direction the same as that of the electrode, and is electrically connected to two electrodes that are close to each other and that are respectively located on two neighboring photovoltaic cells, so that the two neighboring photovoltaic cells are connected in series or connected in parallel.

20 Claims, 15 Drawing Sheets

(51) Int. Cl.
*H01L 31/0224* (2006.01)
*H01L 31/068* (2012.01)

(52) U.S. Cl.
CPC .... *H01L 31/03529* (2013.01); *H01L 31/0516* (2013.01); *H01L 31/068* (2013.01); *Y02E 10/50* (2013.01)

(56) References Cited

FOREIGN PATENT DOCUMENTS

| | | |
|---|---|---|
| CN | 105633177 A | 6/2016 |
| CN | 205319169 U | 6/2016 |
| CN | 205863186 U | 1/2017 |
| JP | S60260164 A | 12/1985 |
| JP | H0415962 A | 1/1992 |
| JP | 2005011869 A | 1/2005 |
| JP | 2006324590 A | 11/2006 |
| JP | 2016503959 A | 2/2016 |

* cited by examiner

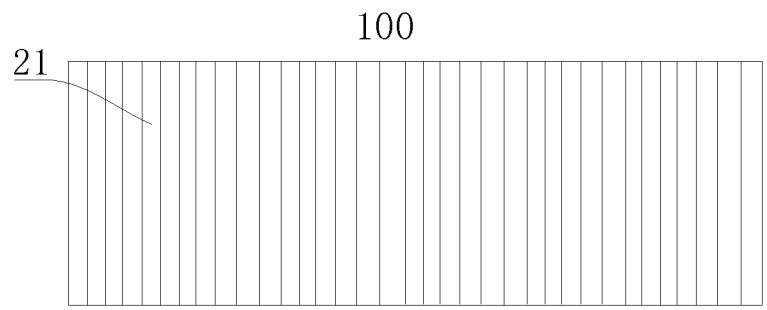
FIG. 25
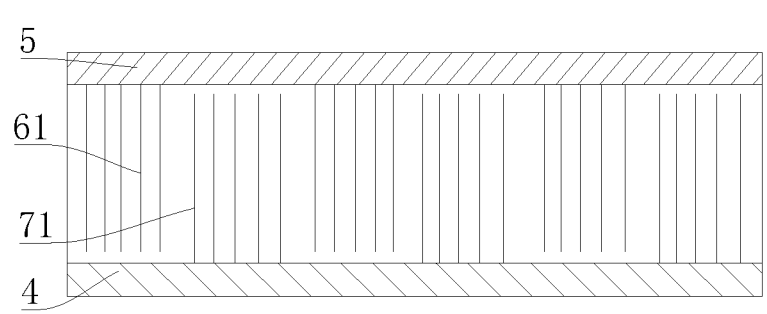
FIG. 26
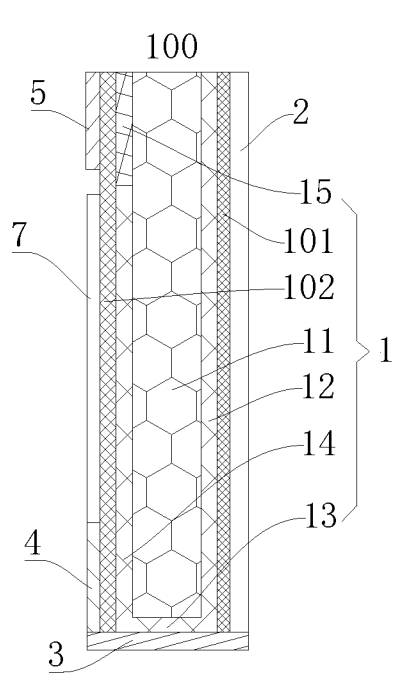 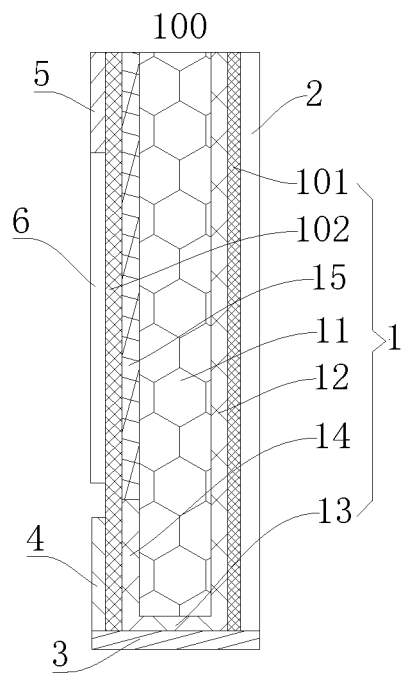
FIG. 27      FIG. 28

(a)

(b)

(c)

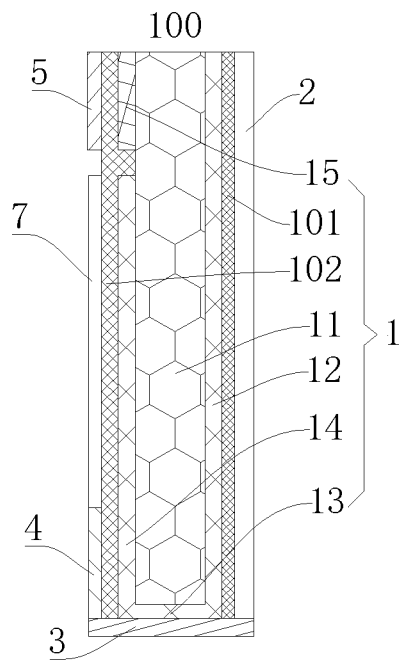
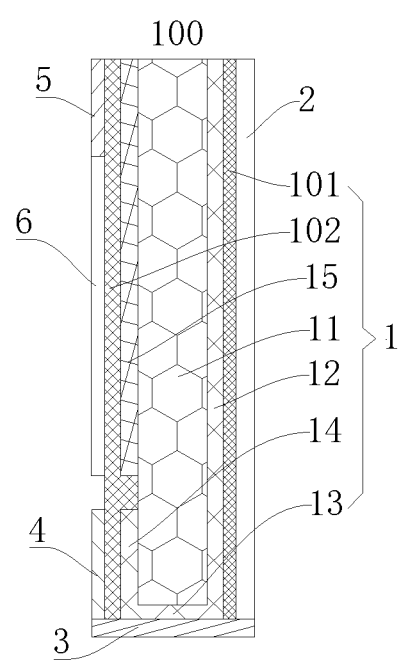
FIG. 34   FIG. 35
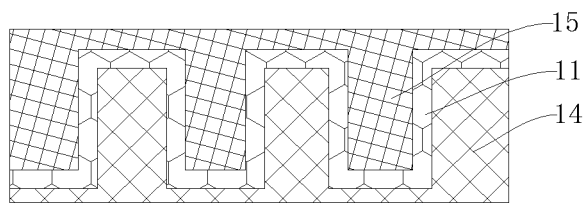
(a)
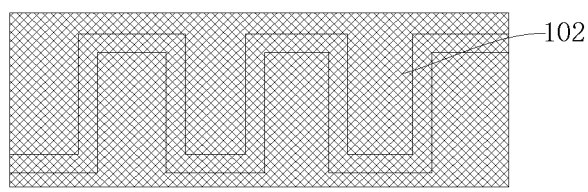
(b)
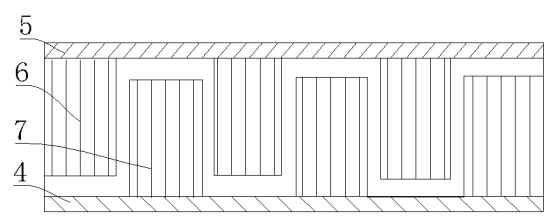
(c)
FIG. 36

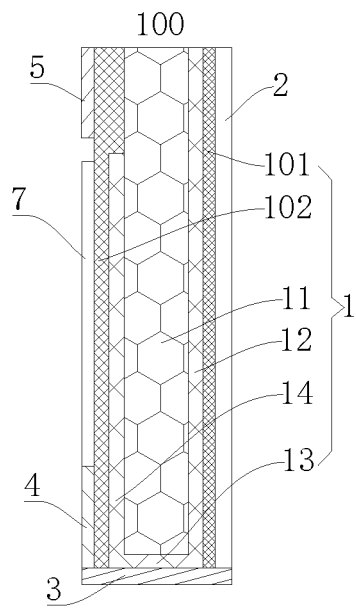
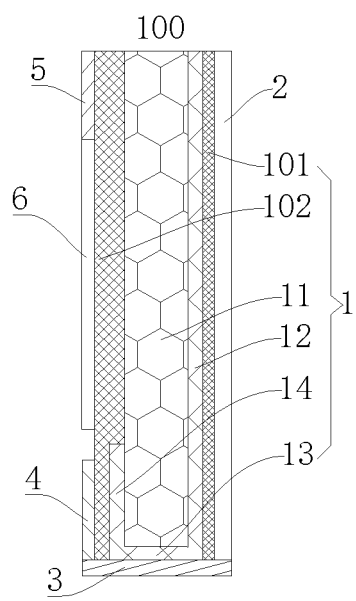
FIG. 41  FIG. 42
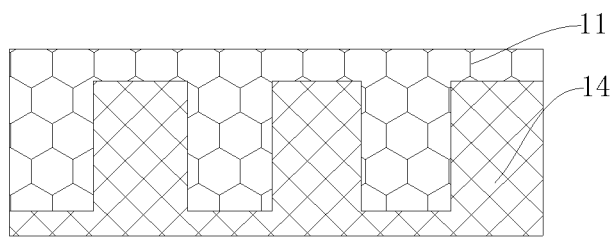
(a)
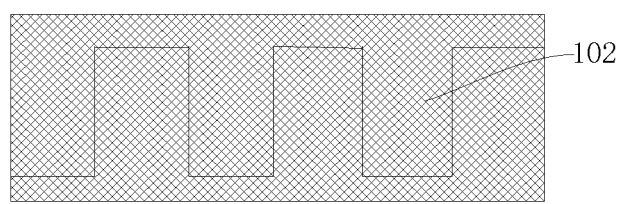
(b)
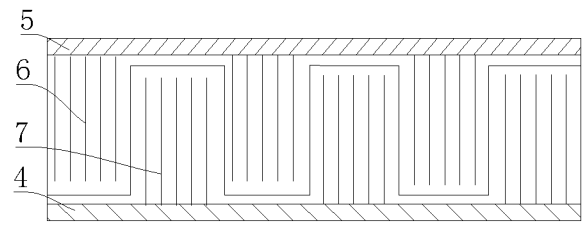
(c)
FIG. 43

PHOTOVOLTAIC CELL ASSEMBLY, PHOTOVOLTAIC CELL ARRAY, AND SOLAR CELL ASSEMBLY

CROSS-REFERENCE TO RELATED APPLICATIONS

This application is a national phase entry under 35 U.S.C. § 371 of International Application No. PCT/CN2017/089820, filed on Jun. 23, 2017, which claims a priority to and benefits of Chinese Patent Application Serial No. 201610510202.X, filed with the State Intellectual Property Office of P. R. China on Jun. 30, 2016, and Chinese Patent Application Serial No. 201620686961.7, filed with the State Intellectual Property Office of P. R. China on Jun. 30, 2016, the entire content of all of which is incorporated herein by reference.

FIELD

The disclosure relates to the field of solar cell technologies and, in particular, to a photovoltaic cell assembly, a photovoltaic cell array, and a solar cell assembly.

BACKGROUND

For a crystalline silicon solar photovoltaic cell in the related art, each of a back surface and a front surface has 2 to 3 silver primary gate lines as positive and negative electrodes of the photovoltaic cell. These silver primary gate lines not only consume a large quantity of silver paste, but also cause a decrease in the efficiency of the photovoltaic cell because of blocking incident light. In addition, the positive and negative electrodes are respectively distributed on the back surface and the front surface of the photovoltaic cell. Therefore, when photovoltaic cells are connected in series, a negative electrode of a front surface of a photovoltaic cell needs to be welded to a positive electrode of a back surface of a neighboring photovoltaic cell by using a conductive band. As a result, problems such as a cumbersome welding process and a large use amount of a welding material are caused. Moreover, during welding and in a subsequent lamination process, the photovoltaic cells and the conductive band are easily damaged. The font surface refers to the light-receiving surface, the back surface refers to the backlight surface.

In addition, the photovoltaic cell array in the related art is usually formed by connecting 72 or 60 photovoltaic cells in series sequentially, to form three loops formed by six cell strings. In this case, at least three diodes are usually required, so that one diode is disposed on each loop to perform bypass protection. A diode is usually disposed in a connection box of a cell. As a result, the costs of the integrated connection box are increased, and the structural complexity of the cell is increased. Moreover, when series-connected components formed by connecting a plurality of photovoltaic cells in series are connected in series again, the use amount of connection cables is large, and the material waste is huge. As a result, the costs of a power station are increased.

SUMMARY

The disclosure aims to resolve at least one of the technical problems existing in the prior art. For this purpose, the disclosure proposes a photovoltaic cell assembly, and the power of the photovoltaic cell assembly is high.

The disclosure further proposes a photovoltaic cell array having the foregoing photovoltaic cell assembly.

The disclosure further proposes a solar cell assembly having the foregoing photovoltaic cell array.

The photovoltaic cell assembly according to a first aspect of the disclosure includes: a plurality of photovoltaic cells arranged sequentially along a longitudinal direction, where each of the photovoltaic cells includes a silicon wafer, a front conductive member disposed on a front surface of the silicon wafer, two electrodes disposed on a back surface of the silicon wafer, and a side conductive member that is disposed on a side surface of the silicon wafer and that is electrically connected between the front conductive member and one of the two electrodes, where the two electrodes extend along a transverse direction and are distributed at an interval in the longitudinal direction; and at least one conductive band, where the conductive band has an extension direction the same as that of the electrode, and is electrically connected to two electrodes that are close to each other and that are respectively located on two neighboring photovoltaic cells to conductively connect the two electrodes located on the two neighboring photovoltaic cells, so that the two neighboring photovoltaic cells are connected in series or connected in parallel. Wherein a front surface of the silicon wafer refers to a light-receiving surface of the silicon wafer, a back surface of the silicon wafer refers to a backlight surface of the silicon wafer.

In the photovoltaic cell assembly according to the disclosure, the use length of the conductive band may be effectively reduced, to reduce the use amount of the conductive band, reduce the thermal effect caused by the conductive band, and improve the entire power of the photovoltaic cell assembly.

In some embodiments, in the extension direction of the conductive band, an extension length of the conductive band is greater than or equal to an extension length of each electrode conductively connected by the conductive band, and each of two ends of the conductive band exceeds or is flush with a corresponding end of each electrode conductively connected by the conductive band.

In some embodiments, in a direction perpendicular to the extension direction of the conductive band, a span of the conductive band is greater than or equal to a sum of spans of the two electrodes conductively connected by the conductive band, and two side edges of the conductive band respectively exceed or are flush with two side edges, away from each other, of the two electrodes conductively connected by the conductive band.

In some embodiments, the conductive band includes two half portions whose structures are the same and that are arranged sequentially perpendicular to the extension direction of the conductive band, and the two half portions exactly respectively cover the two electrodes conductively connected by the conductive band.

In some embodiments, in a direction perpendicular to the extension direction of the conductive band, a gap between the two neighboring photovoltaic cells is less than or equal to 0.1 mm.

In some embodiments, a span of the silicon wafer in a direction perpendicular to the side surface on which the side conductive member is located is from 20 mm to 60 mm.

In some embodiments, the silicon wafer is a rectangular sheet and is formed by dividing a square regular silicon wafer body according to an unchanged length rule.

In some embodiments, the silicon wafer is a rectangular sheet, the two electrodes on each of the photovoltaic cells are respectively disposed against two long sides of the silicon wafer and extend along a length direction of the silicon wafer, and the side conductive member is disposed on the side surface on one long side of the silicon wafer.

In some embodiments, the two electrodes on each of the photovoltaic cells are respectively a first electrode electrically connected to the side conductive member and a second electrode not electrically connected to the side conductive member; and the silicon wafer includes: a silicon substrate, a front first-type diffusion layer, and a back division layer, where a back surface of the silicon substrate includes a first area and a second area, the front first-type diffusion layer is disposed on a front surface of the silicon substrate, the front conductive member is disposed on the front first-type diffusion layer, the back division layer is disposed on only and fully covers the first area, the first electrode is disposed on the back division layer, and the second electrode is disposed on the second area and is not in contact with the first electrode, where at least a part of the back division layer is an insulation layer or a diffusion layer whose type is the same as that of the front first-type diffusion layer. Wherein a back surface of the silicon substrate refers to a backlight surface of the silicon substrate, a front surface of the silicon substrate refers to a light-receiving surface of the silicon substrate.

In some embodiments, the silicon wafer further includes: a side division layer, where the side division layer is disposed on a side surface of the silicon substrate, the side conductive member is disposed on the side division layer, and at least a part of the side division layer is an insulation layer or a diffusion layer whose type is the same as that of the front first-type diffusion layer.

In some embodiments, each of the photovoltaic cells further includes: a back electrical layer, where the back electrical layer is disposed on the second area, and the second electrode is disposed on the back electrical layer and is electrically connected to the back electrical layer.

In some embodiments, each of the photovoltaic cells further includes: a second back gate line layer, where the second back gate line layer and the second electrode are both disposed on the second area, and the second electrode and the second back gate line layer are electrically connected and are not superimposed on each other.

In some embodiments, the silicon wafer further includes a back second-type diffusion layer whose type is different from that of the front first-type diffusion layer, the back second-type diffusion layer is disposed on only and fully covers the second area, and the second back gate line layer and the second electrode are both disposed on the back second-type diffusion layer.

In some embodiments, each of the photovoltaic cells further includes: a first back gate line layer, where the first back gate line layer and the first electrode are both disposed on the back division layer, and the first electrode and the first back gate line layer are electrically connected and are not superimposed on each other.

In some embodiments, the back division layer is a back first-type diffusion layer whose type is the same as that of the front first-type diffusion layer, the back first-type diffusion layer is disposed on only and fully covers the first area, and the first back gate line layer and the first electrode are both disposed on the back first-type diffusion layer.

In some embodiments, each of the first area and the second area is a non-discrete area.

In some embodiments, the first area and the second area are distributed in a fingers-crossed shape, where the first area includes a first communication area and a plurality of first dispersed areas, and the plurality of first dispersed areas is spaced in a length direction of the first communication area and each is in communication with the first communication area; and the second area includes a second communication area and a plurality of second dispersed areas, and the plurality of second dispersed areas is spaced in a length direction of the second communication area and each is in communication with the second communication area, where the first communication area and the second communication area are disposed in parallel, and the plurality of first dispersed areas and the plurality of second dispersed areas are alternated one by one between the first communication area and the second communication area.

The photovoltaic cell array according to a second aspect of the disclosure is formed by connecting a plurality of photovoltaic cell parallel-connected components in series, where each of the photovoltaic cell parallel-connected components is formed by connecting a plurality of photovoltaic cell series-connected components in parallel, where each of the photovoltaic cell series-connected components is the photovoltaic cell assembly according to according to the first aspect of the disclosure, and the plurality of photovoltaic cells in the photovoltaic cell assembly is connected in series sequentially by using the conductive band.

In the photovoltaic cell array according to the disclosure, the photovoltaic cell assembly according to the first aspect is disposed, thereby improving the entire power of the photovoltaic cell array.

In some embodiments, a quantity of the photovoltaic cell parallel-connected components is two, and each of the photovoltaic cell parallel-connected components includes three photovoltaic cell series-connected components.

The solar cell assembly according to a third aspect of the disclosure includes: a first panel, a first bonding layer, a cell, a second bonding layer, and a second panel disposed sequentially from a front side to a back side, where the cell is the photovoltaic cell assembly according to the first aspect of the disclosure or the photovoltaic cell array according to the second aspect of the disclosure.

In the solar cell assembly according to the disclosure, the photovoltaic cell array according to the second aspect or the photovoltaic cell assembly according to the first aspect is disposed, thereby improving the entire performance of the solar cell assembly.

Additional aspects and advantages of embodiments of the disclosure will be given in part in the following descriptions, become apparent in part from the following descriptions, or be learned from the practice of the embodiments of the disclosure.

BRIEF DESCRIPTION OF THE DRAWINGS

FIG. 25 is a schematic diagram of a front side of a photovoltaic cell according to Embodiment 5 of the disclosure;

FIG. 26 is a schematic diagram of a back side of the photovoltaic cell shown in FIG. 25;

FIG. 27 is a schematic diagram of a side surface of the photovoltaic cell shown in FIG. 25;

FIG. 28 is a schematic diagram of another side surface of the photovoltaic cell shown in FIG. 25;

FIG. 34 is a schematic diagram of a side surface of the photovoltaic cell shown in FIG. 32;

FIG. 35 is a schematic diagram of another side surface of the photovoltaic cell shown in FIG. 32;

FIG. 36 is a diagram of a process of preparing a back side of the photovoltaic cell shown in FIG. 33;

FIG. 41 is a schematic diagram of a side surface of the photovoltaic cell shown in FIG. 39;

FIG. 42 is a schematic diagram of another side surface of the photovoltaic cell shown in FIG. 39;

FIG. 43 is a diagram of a process of preparing a back side of the photovoltaic cell shown in FIG. 40;

Figure 1:
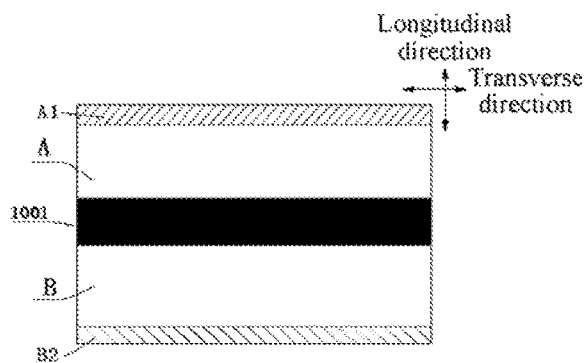
FIG. 1 is a schematic diagram of a photovoltaic cell assembly according to an embodiment of the disclosure.

Reference numerals of the accompanying drawing: photovoltaic cell series-connected component 1000; photovoltaic cell parallel-connected component 2000; photovoltaic cell array 10000; conductive band 1001; busbar 1002; photovoltaic cell assembly 100A; photovoltaic cell 100; photovoltaic cell A; photovoltaic cell B; electrode A1; electrode A2; electrode B1; electrode B2; silicon wafer 1; silicon substrate 11; anti-reflection layer 101; passivation layer 102; front first-type diffusion layer 12; side division layer 13; back division layer 14; back second-type diffusion layer 15; front gate line layer 2; front secondary gate line layer 21; side conductive member 3; first electrode 4; second electrode 5; second back gate line layer 6; second back secondary gate line 61; back electrical layer 60; first back gate line layer 7; first back secondary gate line layer 71.

DETAILED DESCRIPTION

The following describes embodiments of the disclosure in detail. Examples of the embodiments are shown in the accompanying drawings. The same or similar elements and the elements having same or similar functions are denoted by like reference numerals throughout the descriptions. The embodiments described below with reference to the accompanying drawings are exemplary, aim to explain the disclosure, but cannot be understood as a limitation on the disclosure.

The following provides different embodiments or examples to achieve different structures of the disclosure. To simplify the disclosure, components and settings of specific examples are described below. Certainly, they are merely examples, and are not intended to limit the disclosure. In addition, the disclosure can repeat reference numbers and/or reference letters in different examples, but such repetitions are for simplification and clarity, which do not indicate relationships between the embodiments and/or settings discussed. In addition, the disclosure provides examples of various specific processes and materials, but a person of ordinary skill in the art can realize applicability of other processes and/or use of other materials.

A photovoltaic cell assembly 100A according to an embodiment of a first aspect of the disclosure is described below with reference to FIG. 1 to FIG. 45.

The photovoltaic cell assembly 100A according to the embodiment of the first aspect of the disclosure includes: at least two photovoltaic cells 100 and at least one conductive band 1001. The photovoltaic cell 100 is a back contact-type solar photovoltaic cell.

In an embodiment, each photovoltaic cell 100 includes a silicon wafer 1, a front conductive member (for example, a front gate line layer 2 described below) disposed on a front surface of the silicon wafer 1, two electrodes (for example, a first electrode 4 and a second electrode 5 described below) disposed on a back surface of the silicon wafer 1, and a side conductive member 3 disposed on a side surface of the silicon wafer 1 and electrically connected between the front conductive member and one of the two electrodes, where the two electrodes are a positive electrode and a negative electrode whose polarities are opposite and that are not in contact with each other. In this way, when the front surface of the silicon wafer 1 is irradiated by light, the front conductive member may collect a type of charges from the front surface of the silicon wafer 1 and transfer, by using the side conductive member 3, the charges to the one of the two electrodes electrically connected to the side conductive member, and the other electrode obtains another type of charges on a side of the back surface of the silicon wafer 1. Therefore, the two electrodes may output electric energy.

In an embodiment, front surfaces of the plurality of photovoltaic cells 100 are all toward a same side, for example, all face the sun, and back surfaces of the plurality of photovoltaic cells 100 are all toward a same side, for example, are all arranged sequentially along a longitudinal direction with backs to the sun. The two electrodes on each photovoltaic cell 100 extend along a transverse direction and are distributed at an interval in a longitudinal direction, so as to ensure that the two electrodes are not in contact with each other to avoid being short-circuited. It should be noted that, "an extension direction of an electrode" described herein is a length direction of the electrode, and "an extension direction of the conductive band 1001" described below is a length direction of the conductive band 1001. Herein, it should be noted that, "a transverse direction" described herein is an extension direction of a transverse line, for example, a horizontal direction shown in FIG. 1 and FIG. 2, "a longitudinal direction" is an extension direction of a longitudinal line, for example, a vertical direction shown in FIG. 1 and FIG. 2, and the transverse line and the longitudinal line are straight lines perpendicular to each other. In addition, "extending along a transverse direction" is understood broadly, that is, should include "extending along a direction in parallel to the transverse line" and "extending along a direction having an angle less than 45° relative to the transverse line". Wherein the back surface of the plurality of photovoltaic cells 100 refers to the backlight surface of the of the plurality of photovoltaic cells 100, the front surface of the of the plurality of photovoltaic cells 100 refers to the light-receiving surface of the of the plurality of photovoltaic cells 100.

Figure 2:
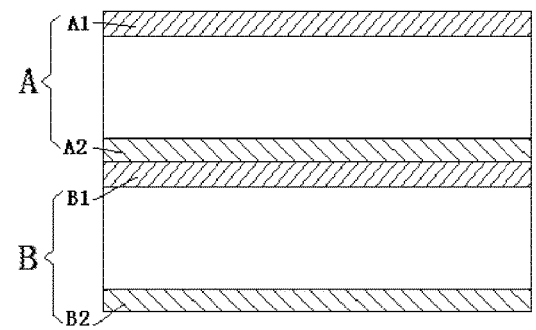
FIG. 2 is a schematic diagram of the photovoltaic cell assembly shown in FIG. 1 having a conductive band removed.

In an embodiment, the conductive band 1001 has an extension direction the same as that of the electrode, so as to be fully electrically connected to the electrode, thereby improving the conductive efficiency, where the conductive band 1001 is electrically connected to two electrodes that are close to each other and that are respectively located on two neighboring photovoltaic cells 100 to conductively connect the two electrodes located on the two neighboring photovoltaic cells, so that the two neighboring photovoltaic cells 100 are connected in series or connected in parallel. Herein, for clear expression, description is made by using an example. Referring to FIG. 1 and FIG. 2, assuming that two neighboring photovoltaic cells 100 are respectively a photovoltaic cell A and a photovoltaic cell B, the photovoltaic cell A has an electrode A1 and an electrode A2 spaced along a longitudinal direction, and the photovoltaic cell B has an electrode B1 and an electrode B2 spaced along the longitudinal direction. When the photovoltaic cell A and the photovoltaic cell B are arranged sequentially along the longitudinal direction, the electrode A1, the electrode A2, the electrode B1, and the electrode B2 are arranged sequentially along the longitudinal direction. In this case, the electrode A2 and the electrode B1 are close to each other, and the electrode A1 and the electrode B2 are away from each other. In this case, the conductive band 1001 is electrically connected to the electrode A2 and the electrode B1 to conductively connect the electrode A2 and the electrode B1. In this case, when the electrode A2 and the electrode B1 have a same polarity (that is, both are positive electrodes or negative electrodes), the photovoltaic cell A and the photovoltaic cell B may be connected in parallel, and when the electrode A2 and the electrode B1 have different polarities (that is, one is a positive electrode, and the other is a negative electrode), the photovoltaic cell A and the photovoltaic cell B may be connected in series.

Below, description is made by using only an example in which a vertical direction shown in FIG. 1 and FIG. 2 is a "longitudinal direction" and a horizontal direction shown in FIG. 1 and FIG. 2 is a "transverse direction". Certainly, after reading the following technical solution, a person skilled in the art may obviously understand a technical solution in which another direction is a "longitudinal direction". In addition, it should be noted that, a directional or positional relationship shown in the accompanying drawings of this application is only for convenience of describing the disclosure and simplifying description, but does not indicate or imply that the mentioned apparatus or element needs to have a particular direction and be constructed and operated in the particular direction, and therefore cannot be understood as a limitation on the disclosure.

As shown in FIG. 1 and FIG. 2, the plurality of photovoltaic cells 100 is arranged sequentially in the longitudinal direction, where two electrodes on each photovoltaic cell 100 extend along the transverse direction and are distributed at an interval in the longitudinal direction, so that each of the top and the bottom of each photovoltaic cell 100 has an electrode. Therefore, an upper electrode (for example, the electrode B1) of a remaining photovoltaic cell 100 (for example, the photovoltaic cell B) other than an uppermost photovoltaic cell 100 (for example, the photovoltaic cell A) and a lower electrode (for example, the electrode A2) of a photovoltaic cell 100 (for example, the photovoltaic cell A) above the remaining photovoltaic cell 100 are close to each other and may be conductively connected by using the conductive band 1001. That is, a lower electrode (for example, the electrode A2) of a remaining photovoltaic cell 100 (for example, the photovoltaic cell A) other than a lowermost photovoltaic cell 100 (for example, the photovoltaic cell B) and an upper electrode (for example, the electrode B1) of a photovoltaic cell 100 (for example, the photovoltaic cell B) below the remaining photovoltaic cell 100 are close to each other and may be conductively connected by using the conductive band 1001.

Therefore, in the photovoltaic cell assembly 100A according to this embodiment of the disclosure, the total area of the conductive band 1001 may be effectively reduced, the thermal effect caused by the conductive band 1001 may be reduced, the use amount of the conductive band 1001 may be reduced, and the entire power of the photovoltaic cell assembly 100A may be improved. The conductive band 1001 may is a solder strip.

Figure 3:
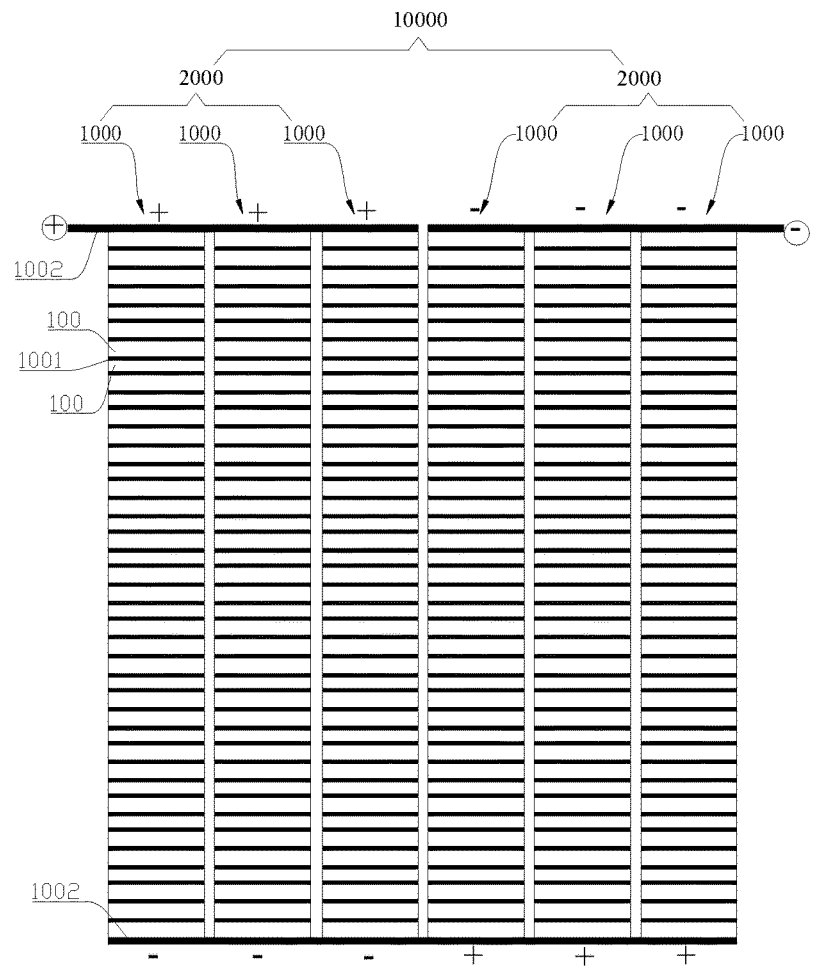
FIG. 3 is a schematic diagram of a photovoltaic cell array according to an embodiment of the disclosure.
Figure 4:
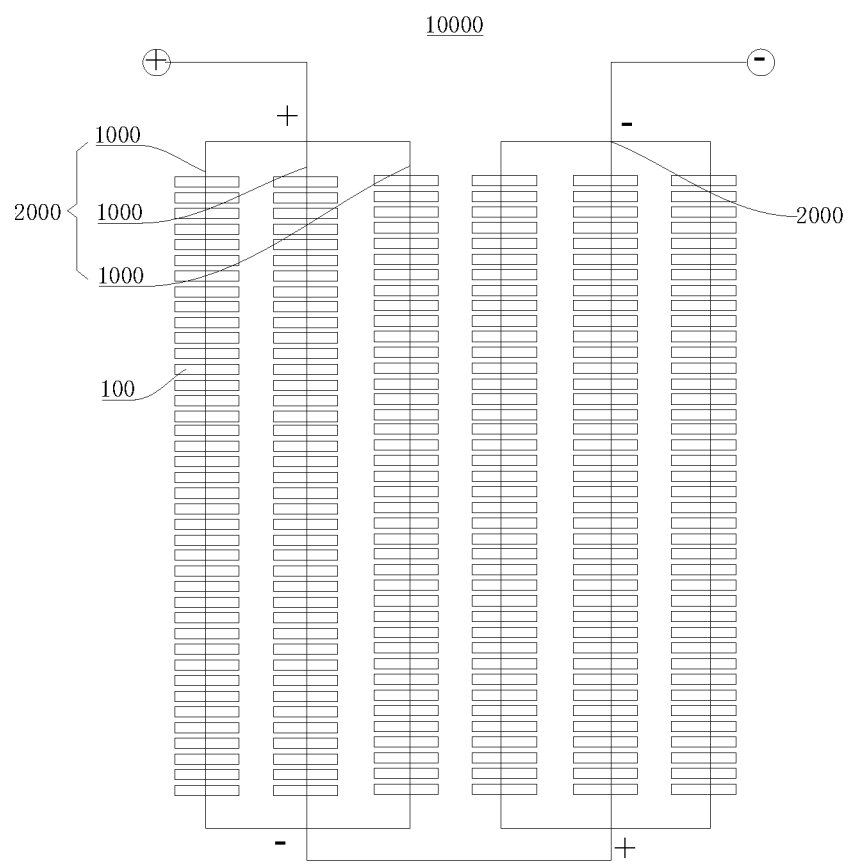
FIG. 4 is a schematic diagram of a circuit of the photovoltaic cell array shown in FIG. 3.
Figure 5:
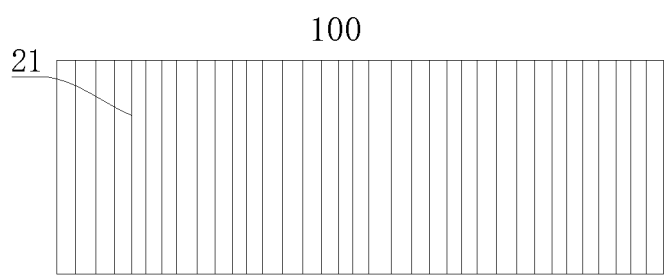
FIG. 5 is a schematic diagram of a front side of a photovoltaic cell according to Embodiment 1 of the disclosure.
Figure 6:
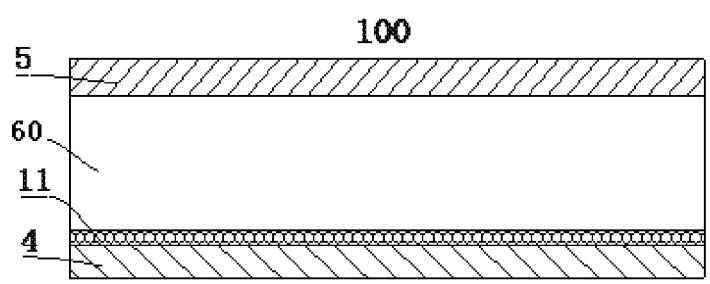
FIG. 6 is a schematic diagram of a back side of the photovoltaic cell shown in FIG. 5.
Figure 7:
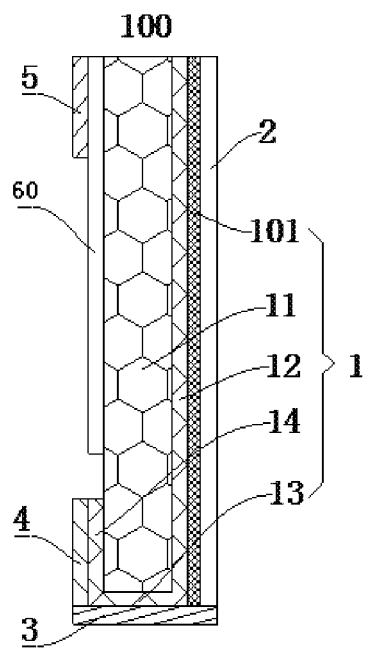
FIG. 7 is a schematic diagram of a side surface of the photovoltaic cell shown in FIG. 5.
Figure 8:
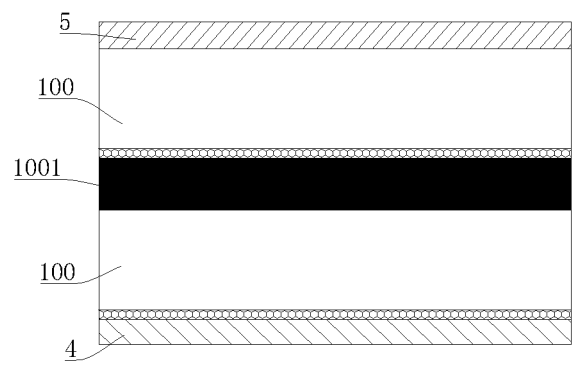
FIG. 8 is a schematic diagram of connecting two photovoltaic cells shown in FIG. 6 by using a conductive band.
Figure 9:
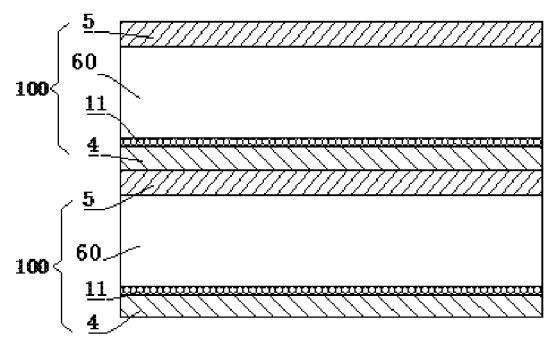
FIG. 9 is a schematic diagram of the two photovoltaic cells shown in FIG. 8 having the conductive band removed.
Figure 10:
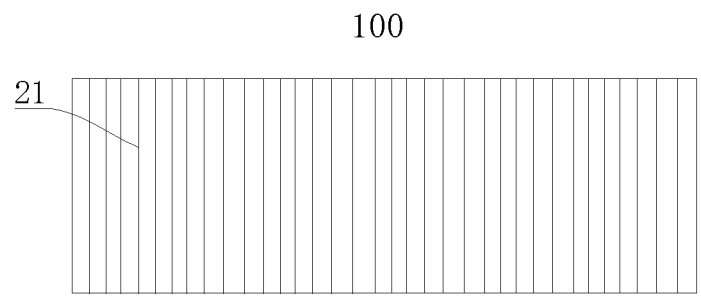
FIG. 10 is a schematic diagram of a front side of a photovoltaic cell according to Embodiment 2 of the disclosure.
Figure 11:
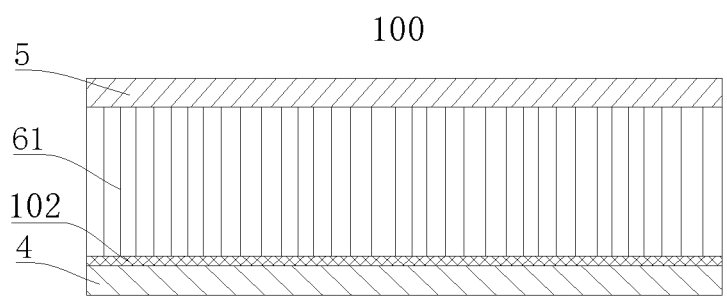
FIG. 11 is a schematic diagram of a back side of the photovoltaic cell shown in FIG. 10.
Figure 12:
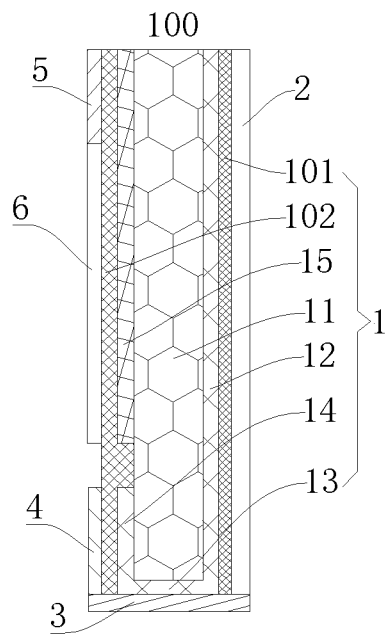
FIG. 12 is a schematic diagram of a side surface of the photovoltaic cell shown in FIG. 10.
Figure 13:
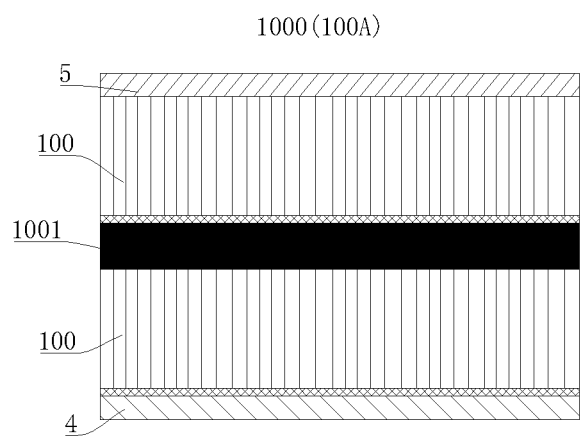
FIG. 13 is a schematic diagram of connecting two photovoltaic cells shown in FIG. 11 by using a conductive band.
Figure 14:
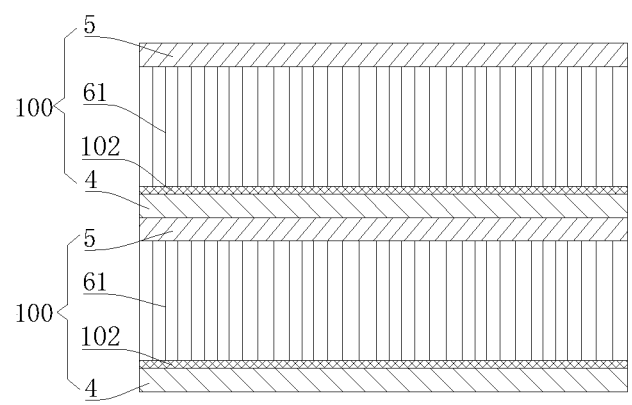
FIG. 14 is a schematic diagram of the two photovoltaic cells shown in FIG. 13 having the conductive band removed.
Figure 15:
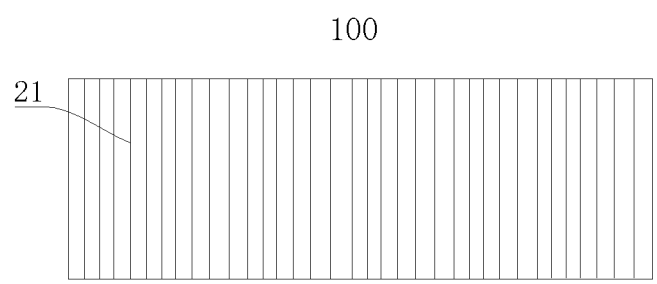
FIG. 15 is a schematic diagram of a front side of a photovoltaic cell according to Embodiment 3 of the disclosure.
Figure 16:
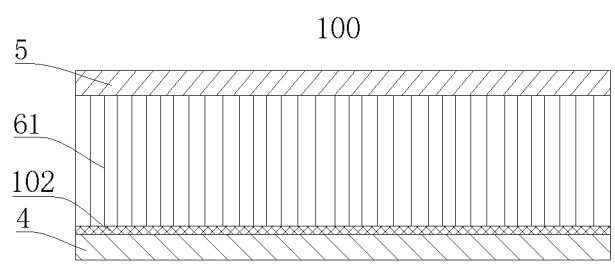
FIG. 16 is a schematic diagram of a back side of the photovoltaic cell shown in FIG. 15.
Figure 17:
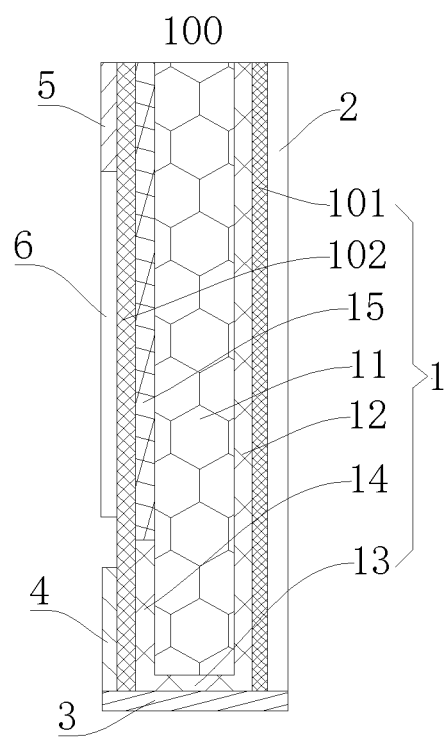
FIG. 17 is a schematic diagram of a side surface of the photovoltaic cell shown in FIG. 15.
Figure 18:
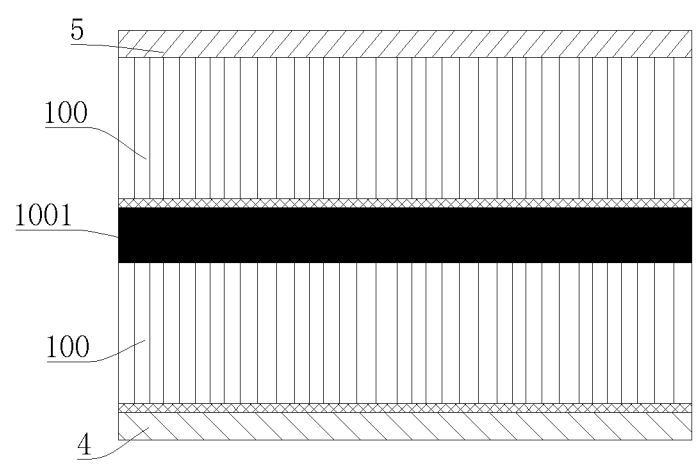
FIG. 18 is a schematic diagram of connecting two photovoltaic cells shown in FIG. 16 by using a conductive band.
Figure 19:
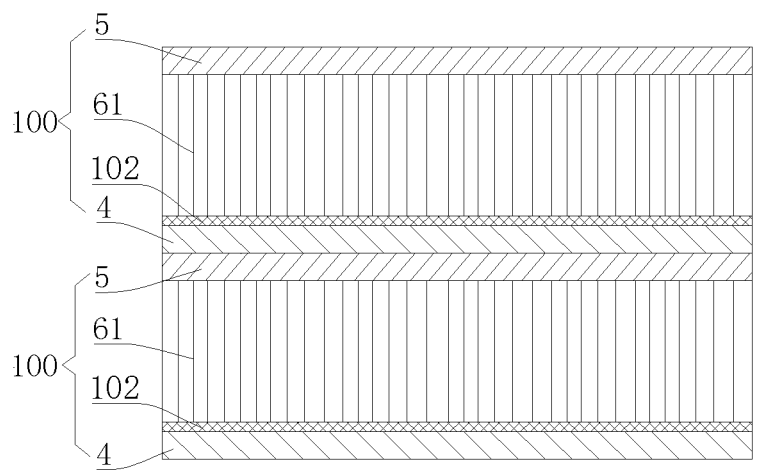
FIG. 19 is a schematic diagram of the two photovoltaic cells shown in FIG. 18 having the conductive band removed.
Figure 20:
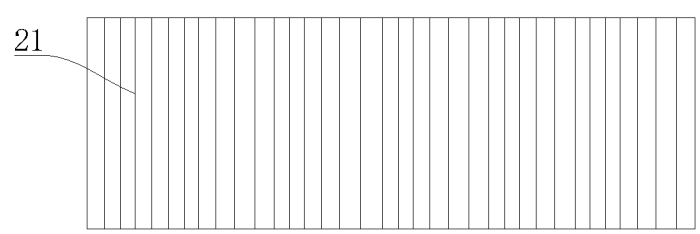
FIG. 20 is a schematic diagram of a front side of a photovoltaic cell according to Embodiment 4 of the disclosure.
Figure 21:
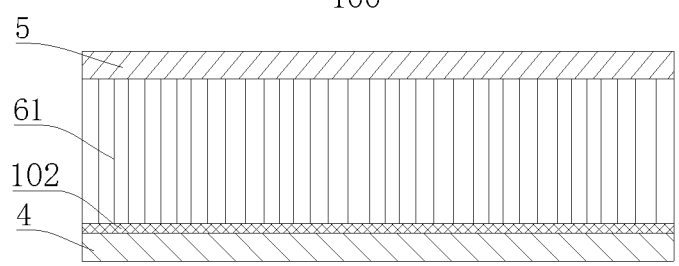
FIG. 21 is a schematic diagram of a back side of the photovoltaic cell shown in FIG. 20.
Figure 22:
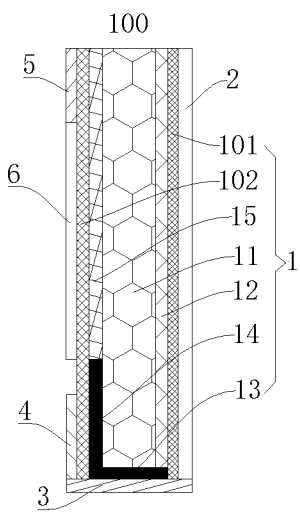
FIG. 22 is a schematic diagram of a side surface of the photovoltaic cell shown in FIG. 20.
Figure 23:
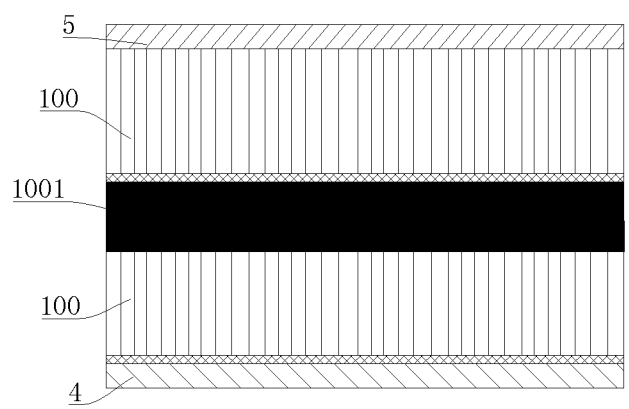
FIG. 23 is a schematic diagram of connecting two photovoltaic cells shown in FIG. 21 by using a conductive band.
Figure 24:
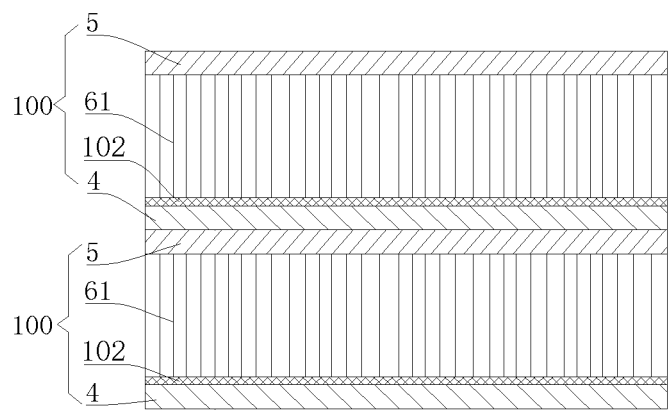
FIG. 24 is a schematic diagram of the two photovoltaic cells shown in FIG. 23 having the conductive band removed.
Figure 29:
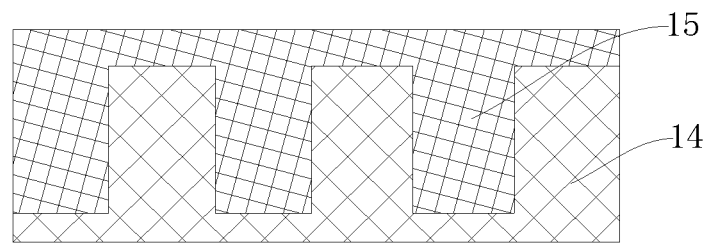
FIG. 29 is a diagram of a process of preparing a back side of the photovoltaic cell shown in FIG. 26.
Figure 29:
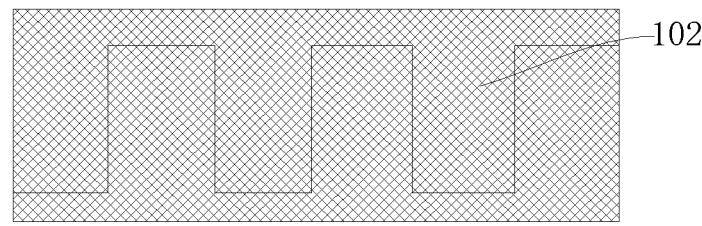
Figure 29:
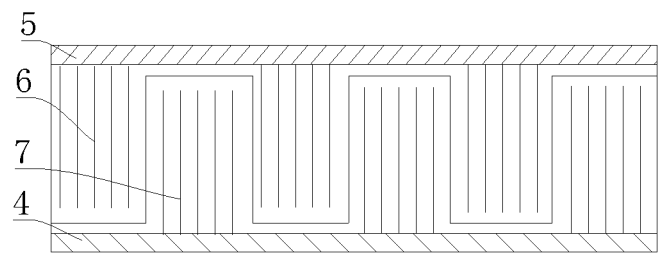
Figure 30:
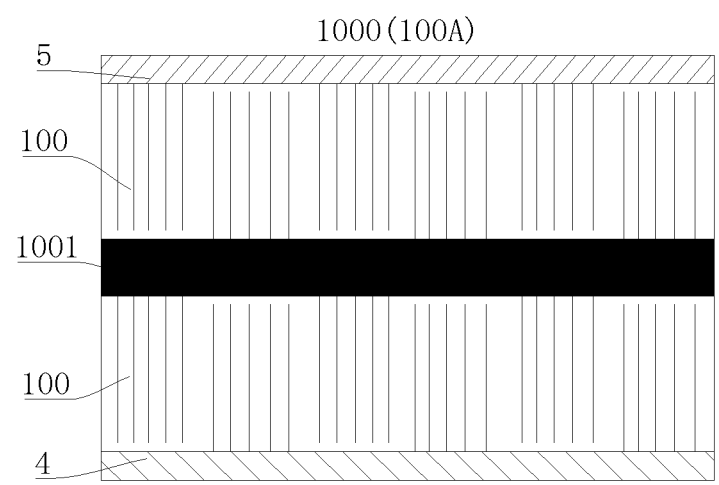
FIG. 30 is a schematic diagram of connecting two photovoltaic cells shown in FIG. 26 by using a conductive band.
Figure 31:
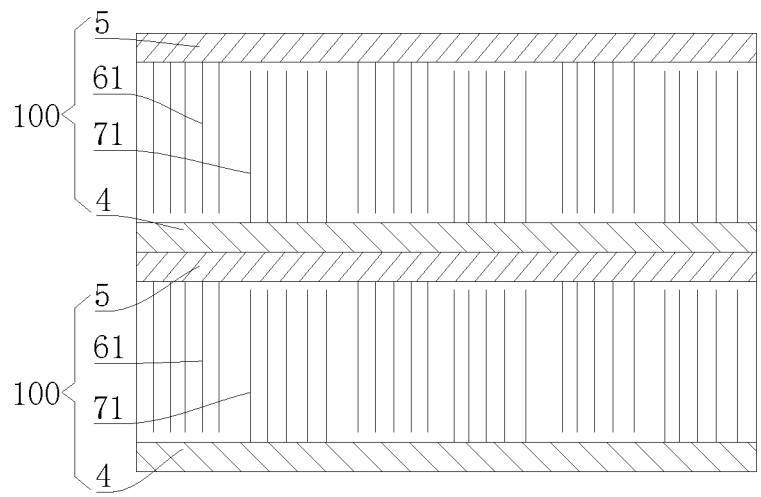
FIG. 31 is a schematic diagram of the two photovoltaic cells shown in FIG. 30 having the conductive band removed.
Figure 32:
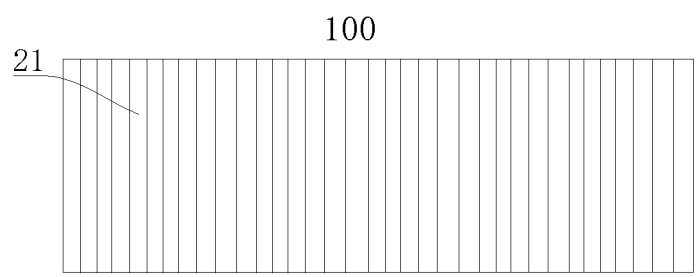
FIG. 32 is a schematic diagram of a front side of a photovoltaic cell according to Embodiment 6 of the disclosure.
Figure 33:
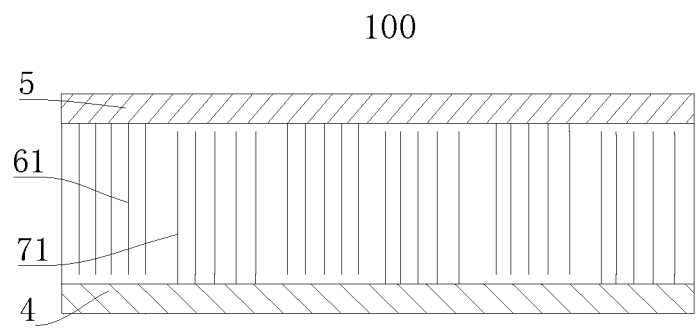
FIG. 33 is a schematic diagram of a back side of the photovoltaic cell shown in FIG. 32.
Figure 37:
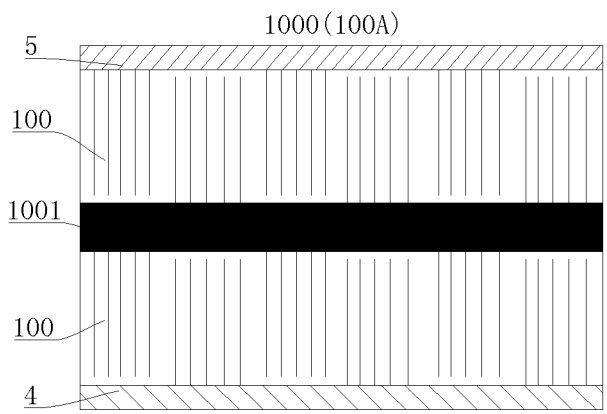
FIG. 37 is a schematic diagram of connecting two photovoltaic cells shown in FIG. 33 by using a conductive band.
Figure 38:
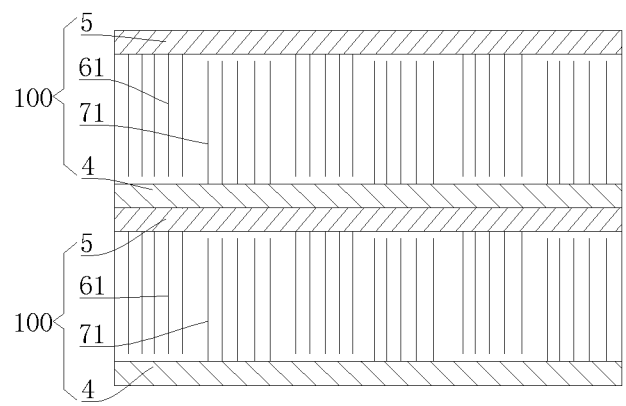
FIG. 38 is a schematic diagram of the two photovoltaic cells shown in FIG. 37 having the conductive band removed.
Figure 39:
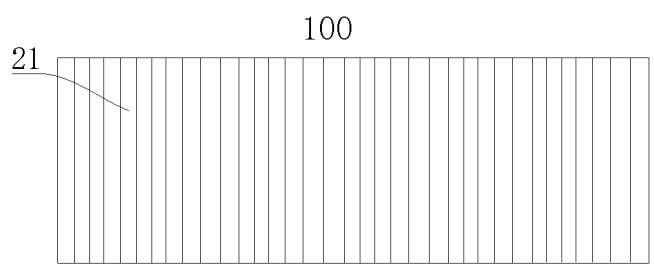
FIG. 39 is a schematic diagram of a front side of a photovoltaic cell according to Embodiment 7 of the disclosure.
Figure 40:
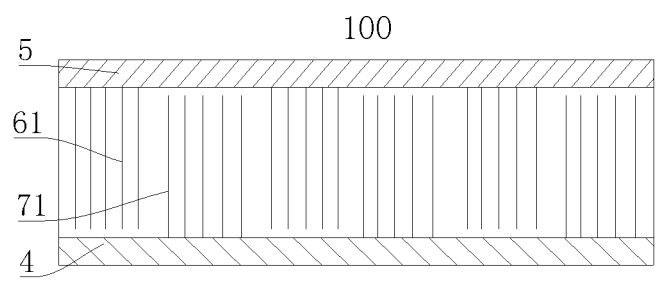
FIG. 40 is a schematic diagram of a back side of the photovoltaic cell shown in FIG. 39.
Figure 44:
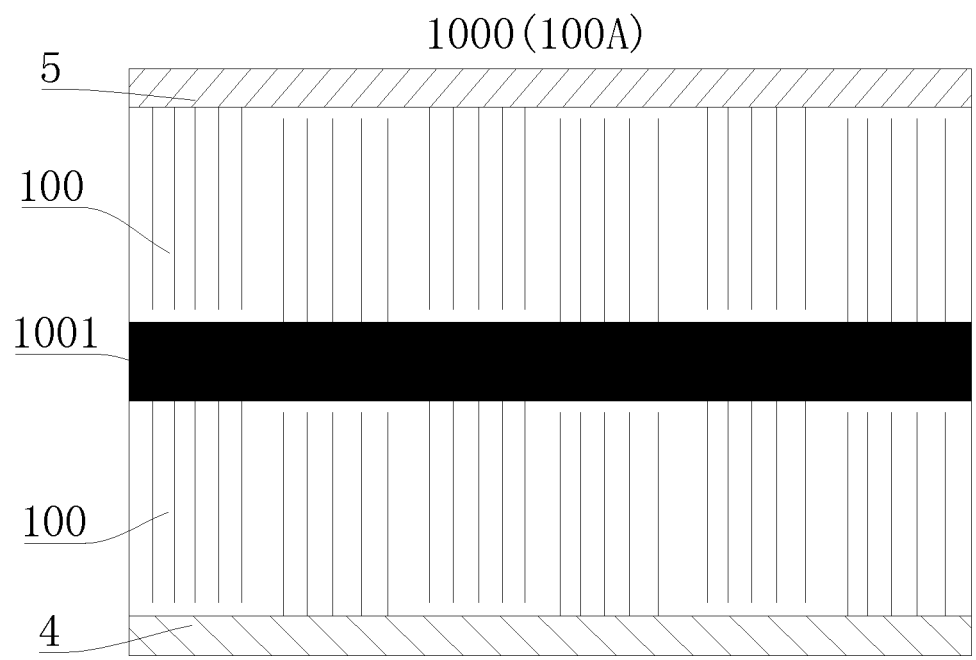
FIG. 44 is a schematic diagram of connecting two photovoltaic cells shown in FIG. 40 by using a conductive band.
Figure 45:
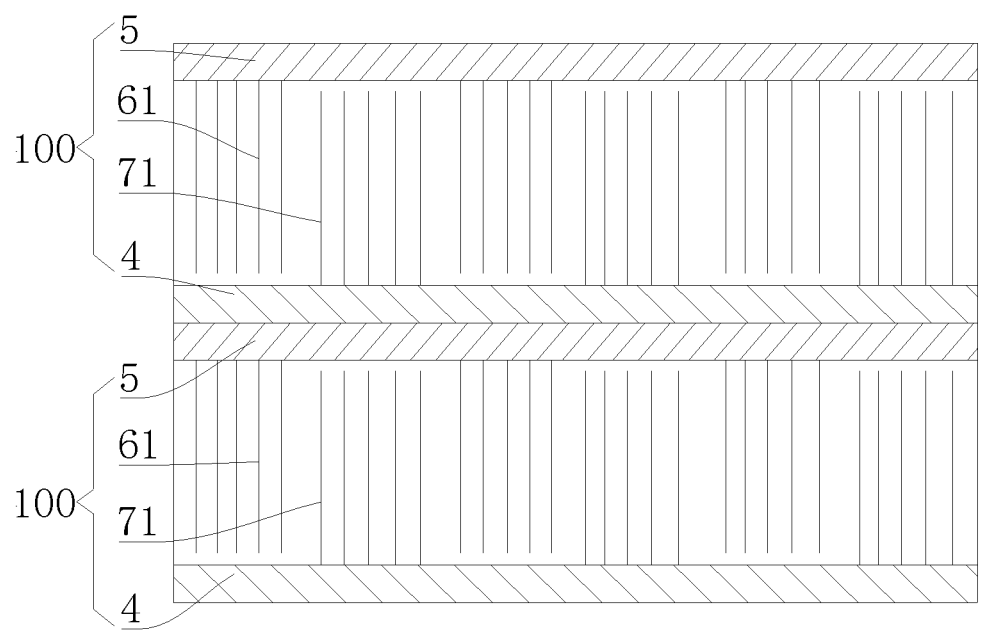
FIG. 45 is a schematic diagram of the two photovoltaic cells shown in FIG. 44 having the conductive band removed.

A photovoltaic cell array 10000 according to an embodiment of a second aspect of the disclosure is described below with reference to FIG. 3 and FIG. 4.

In an embodiment, when a plurality of photovoltaic cells 100 in a photovoltaic cell assembly 100A is connected in series sequentially by using a conductive band 1001, the photovoltaic cell assembly 100A is a photovoltaic cell series-connected component 1000. The photovoltaic cell array 10000 is formed by a plurality of photovoltaic cell parallel-connected components 2000 connected in series, where each photovoltaic cell parallel-connected component 2000 is formed by a plurality of photovoltaic cell series-connected components 1000 connected in parallel. That is, a plurality of photovoltaic cell series-connected components 1000 is first connected in parallel to form the plurality of photovoltaic cell parallel-connected components 2000, and the plurality of photovoltaic cell parallel-connected components 2000 is then connected in series to form the photovoltaic cell array 10000. Therefore, the power of the photovoltaic cell array 10000 is effectively increased, and no diode needs to be added to perform bypass protection, thereby reducing the costs of a cell. In addition, positive and negative connection boxes may be distributed on two sides of the photovoltaic cell array 10000, thereby reducing the use amount of a connection cable between neighboring components, and reducing the costs of a power station.

For example, in an embodiment of the disclosure, a quantity of the photovoltaic cell parallel-connected components 2000 is two, and each photovoltaic cell parallel-connected component 2000 is formed by connecting three photovoltaic cell series-connected components 1000 in parallel. That is, six photovoltaic cell series-connected components 1000 form the photovoltaic cell array 10000 in a manner of "three pieces connected in parallel first and then two pieces connected in series". That is, the six photovoltaic cell series-connected components 1000 are first connected in parallel three by three to form two photovoltaic cell parallel-connected components 2000, and then the two photovoltaic cell parallel-connected components 2000 are connected in series to form the photovoltaic cell array 10000.

Herein, it should be noted that, the photovoltaic cell array in the related art usually includes 60 photovoltaic cells connected in series sequentially, where each ten photovoltaic cells are first connected in series to form a photovoltaic cell string, and six photovoltaic cell strings are then connected in series sequentially, so that the 60 photovoltaic cells may be all connected in series sequentially. When the voltage of each photovoltaic cell is 0.5 V, the voltage of the 60 photovoltaic cells connected in series is 30 V. In this case, if a photovoltaic cell string has a failure, the entire photovoltaic cell array cannot normally operate, and therefore three diodes need to be connected in parallel. In this way, even if a photovoltaic cell string has a failure, the circuit still forms a loop by using the diodes connected in parallel, and the photovoltaic cell array may still continue to normally operate and cannot go so far as to be scrapped, but only the power is small. However, on one hand, the production costs of the diode are relatively high, and on the other hand, because a diode needs to be disposed in a connection box, the connection box is disposed at an edge in the middle of a cell plate close to a width direction, and the positive and negative electrodes are led out by using the connection box, the integrated connection box used in the component also increases the production costs. In addition, because the connection box is located at the center of the component, when components are connected in series, the use amount of a connection cable is large, the material waste is caused, and the costs of a power station are also increased.

Relatively, the width of the photovoltaic cell 100 herein may be ¼ of the width of the regular photovoltaic cell. In this case, the total voltage of a photovoltaic cell series-connected component 1000 formed by connecting ten photovoltaic cells 100 in series is 20 V (that is, 40×0.5 V=20 V), and therefore, the voltage of such two photovoltaic cell series-connected components 1000 connected in series may reach 40 V, thereby effectively reaching the service voltage. In addition, when the photovoltaic cell array 10000 is formed in the manner of "three pieces connected in parallel first and then two pieces connected in series" described above, because a parallel-connected structure may protect a parallel-connected bypass, no additional diode needs to be added to perform bypass protection, thereby reducing the production costs. In addition, because the positive and negative connection boxes may be distributed on two sides of the photovoltaic cell array 10000, the use amount of a connection cable between components is reduced, and the costs of a power station is further reduced.

A solar cell assembly according to an embodiment of a third aspect of the disclosure is described below.

In an embodiment, the solar cell assembly includes: a first panel, a first bonding layer, a cell, a second bonding layer, and a second panel disposed sequentially from a front side to a back side. The cell may be the photovoltaic cell assembly 100A according to the foregoing embodiment of the first aspect, or may be the photovoltaic cell array 10000 according to the foregoing embodiment of the second aspect. Therefore, the solar cell assembly has higher power, higher energy efficiency, and lower costs, and is manufactured more simply and conveniently. Wherein a front side refers to a light-receiving side, a back side refers to a backlight side.

A method for preparing a solar cell assembly according to an embodiment of a fourth aspect of the disclosure is described below.

First, a cell is prepared.

In an embodiment, when the cell is a photovoltaic cell assembly 100A, two neighboring photovoltaic cells 100 may be first connected in series or connected in parallel by using a conductive band 1001 to obtain the photovoltaic cell assembly 100A, and then a positive electrode and a negative electrode of the photovoltaic cell assembly 100A are respectively led out by using a busbar 1002.

In an embodiment, when the cell is a photovoltaic cell array 10000, two neighboring photovoltaic cells 100 may be first connected in series by using a conductive band 1001 to obtain a plurality of photovoltaic cell series-connected components 1000, then the plurality of photovoltaic cell series-connected components 1000 is connected in parallel by using a busbar 1002 to obtain a plurality of photovoltaic cell parallel-connected components 2000, then the plurality of photovoltaic cell parallel-connected components 2000 is connected in series by using the busbar 1002 to obtain the photovoltaic cell array 10000, and finally a positive electrode and a negative electrode of the photovoltaic cell array 10000 are respectively led out by using the busbar 1002.

Then, a first panel, a first bonding layer, a cell, a second bonding layer, and a second panel are laid sequentially in a vertical direction to obtain a lamination structure, and then the lamination structure is laminated and encapsulated. For example, the first panel (for example, glass), the first bonding layer (for example, EVA), the cell, the second bonding layer (for example, EVA), and the second panel (for example, cell backboard or glass) may be first laid sequentially in an order from the bottom up to obtain the lamination structure, then the lamination structure in the previous step is placed into a lamination machine and laminated, and a connection box and a frame are mounted, thereby encapsulating and manufacturing the solar cell assembly.

Photovoltaic cells 100 according to a plurality of embodiments of the disclosure are described below with reference to FIG. 1 and FIG. 2 and with reference to FIG. 5 to FIG. 45.

In an embodiment of the disclosure, in the extension direction of the conductive band 1001, an extension length of the conductive band 1001 is greater than or equal to an extension length of each electrode conductively connected by the conductive band 1001, and each of two ends of the conductive band 1001 exceeds or is flush with a corresponding end of each electrode conductively connected by the conductive band 1001. However, it should be noted that, when each of two ends of the conductive band 1001 exceeds a corresponding end of each electrode conductively connected by the conductive band 1001, the conductive band 1001 needs to keep a safe distance from a conductive medium that is on each silicon wafer 1 and whose charges are opposite to charges carried in the electrode conductively connected by the conductive band 1001, so as to prevent two electrodes on a same silicon wafer 1 from being short-circuited.

For example, in the example shown in FIG. 1 and FIG. 2, both the electrode A2 and the electrode B1 extend along the transverse direction, the conductive band 1001 also extends along the transverse direction, the length of the conductive band 1001 in the transverse direction is greater than or equal to the length of the electrode A2 in the transverse direction, and is also greater than or equal to the length of the electrode B1 in the transverse direction, and two ends of the conductive band 1001 in the transverse direction are respectively a left end and a right end. The left end of the conductive band 1001 exceeds or is flush with the left end of the electrode A2 toward the left, and the left end of the conductive band 1001 also exceeds or is flush with the left end of the electrode B1 toward the left. The right end of the conductive band 1001 exceeds or is flush with the right end of the electrode A2 toward the right, and the right end of the conductive band 1001 also exceeds or is flush with the right end of the electrode B1 toward the right. Moreover, each of the left and right ends of the conductive band 1001 also needs to keep a safe distance from each of the electrode A1, a conductive medium electrically connected to the electrode A1, the electrode B2, and a conductive medium electrically connected to the electrode B2, so as to prevent the electrode A1 and the electrode A2 from being short-circuited, and also prevent the electrode B1 and the electrode B2 from being short-circuited. Therefore, it may be ensured that the conductive band 1001 is fully connected to the electrodes, to reduce the total area of the conductive band 1001, reduce the thermal effect caused by the conductive band 1001, reduce the use amount of the conductive band 1001, and increase the entire power of the photovoltaic cell assembly 100A.

In an embodiment of the disclosure, in a direction perpendicular to the extension direction of the conductive band 1001, a span of the conductive band 1001 is greater than or equal to a sum of spans of the two electrodes conductively connected by the conductive band 1001, and two side edges of the conductive band 1001 respectively exceed or are flush with two side edges, away from each other, of the two electrodes conductively connected by the conductive band 1001. However, it should be noted that, when two side edges of the conductive band 1001 respectively exceed two side edges away from each other of the two electrodes conductively connected by the conductive band 1001, the conductive band 1001 needs to keep a safe distance from a conductive medium that is on each silicon wafer 1 and whose charges are opposite to charges carried in the electrode conductively connected by the conductive band 1001, so as to prevent two electrodes on a same silicon wafer 1 from being short-circuited.

For example, in the example shown in FIG. 1 and FIG. 2, both the electrode A2 and the electrode B1 extend along the transverse direction, the conductive band 1001 also extends along the transverse direction, the width of the conductive band 1001 in the longitudinal direction is greater than or equal to a sum of the width of the electrode A2 in the longitudinal direction and the width of the electrode B1 in the longitudinal direction, and two side edges of the conductive band 1001 in the longitudinal direction are respectively an upper side edge and a lower side edge. The upper side edge of the conductive band 1001 exceeds or is flush with the upper side edge of the electrode A2 upward, and the lower side edge of the conductive band 1001 exceeds or is flush with the lower side edge of the electrode B1 downward. Moreover, each of the upper side edge and the lower side edge of the conductive band 1001 also needs to keep a safe distance from each of the electrode A1, a conductive medium electrically connected to the electrode A1, the electrode B2, and a conductive medium electrically connected to the electrode B2, so as to prevent the electrode A1 and the electrode A2 from being short-circuited, and also prevent the electrode B1 and the electrode B2 from being short-circuited. Therefore, it may be ensured that the conductive band 1001 is fully connected to the electrodes, to reduce the total area of the conductive band 1001, reduce the thermal effect caused by the conductive band 1001, reduce the use amount of the conductive band 1001, and increase the entire power of the photovoltaic cell assembly 100A.

In an optional embodiment of the disclosure, the conductive band 1001 includes two half portions whose structures are the same and that are arranged sequentially perpendicular to the extension direction of the conductive band 1001, and the two half portions exactly respectively cover the two electrodes conductively connected by the conductive band 1001. For example, in the example shown in FIG. 1 and FIG. 2, the conductive band 1001 extends along the transverse direction and includes an upper half portion and a lower half portion arranged sequentially in the longitudinal direction, where the upper half portion exactly covers the electrode A2, that is, the profile line of the upper half portion coincides with the profile line of the electrode A2, and the lower half portion exactly covers the electrode B1, that is, the profile line of the lower half portion coincides with the profile line of the electrode B1. Therefore, it may be ensured that the conductive band 1001 is fully connected to the electrodes, to reduce the total area of the conductive band 1001, reduce the thermal effect caused by the conductive band 1001, reduce the use amount of the conductive band 1001, and increase the entire power of the photovoltaic cell assembly 100A.

Optionally, in a direction perpendicular to the extension direction of the conductive band 1001, a gap between the two neighboring photovoltaic cells 100 is less than or equal to 0.1 mm. That is, the gap between the two neighboring photovoltaic cells 100 is from 0 mm to 0.1 mm. For example, in the example shown in FIG. 1 and FIG. 2, the conductive band 1001 extends along the transverse direction, and the photovoltaic cell A and the photovoltaic cell B are arranged sequentially in the longitudinal direction. In this case, a distance between the lower edge of the photovoltaic cell A and the upper edge of the photovoltaic cell B is a gap between the photovoltaic cell A and the photovoltaic cell B. Therefore, when the gap between the two neighboring photovoltaic cells 100 and perpendicular to the extension direction of the conductive band 1001 is limited to being less than or equal to 0.1 mm, the total area of the conductive band 1001 may be further reduced, the thermal effect caused by the conductive band 1001 may be reduced, the use amount of the conductive band 1001 may be reduced, and the entire power of the photovoltaic cell assembly 100A may be increased. In addition, when a relatively small gap exists between two photovoltaic cells 100, the problem of superimposition between neighboring photovoltaic cells 100 caused because of irregular shapes of the photovoltaic cells 100 or an operation error may be avoided.

In some embodiments of the disclosure, a span of the silicon wafer 1 in a direction perpendicular to the side surface on which the side conductive member 3 is located is from 20 mm to 60 mm. That is, the silicon wafer 1 includes a group of (two) side surfaces disposed opposite to each other, where the side conductive member 3 is disposed on one side surface, and the distance between this group of side surfaces is 20 mm to 60 mm. For example, in the example shown in FIG. 1 and FIG. 2, when the silicon wafer 1 is a rectangular sheet, and the side conductive member 3 is disposed on a side surface on a long side of the silicon wafer 1, the width of the silicon wafer 1 is 20 mm to 60 mm. For example, in another example of the disclosure (the example is not shown), when the silicon wafer 1 is a rectangular sheet, and the side conductive member 3 is disposed on a side surface on a broad side of the silicon wafer 1, the length of the silicon wafer 1 is 20 mm to 60 mm.

Therefore, a path of charges transmitted from the front surface of the silicon wafer 1 to the back surface may be shortened, thereby increasing the charge transfer rate, and then increasing the power of the photovoltaic cell 100. Herein, it should be noted that, the "rectangular sheet" is understood broadly, that is, is not limited to a strictly rectangular sheet. For example, a roughly rectangular sheet such as a rectangular sheet whose four vertex angles have rounded corners or chamfers also falls within the protection scope of the disclosure. Therefore, it is convenient to manufacture the photovoltaic cells 100, and it is convenient to connect the photovoltaic cells 100. Wherein the font surface refers to the light-receiving surface, the back surface refers to the backlight surface.

Optionally, the silicon wafer 1 is a rectangular sheet and is formed by dividing (which means only "separating" and does not particularly mean "taking a cutting process") a square regular silicon wafer body according to an unchanged length rule. That is, a square silicon wafer body may be divided into a plurality of rectangular sheet-shaped silicon wafers 1 in an unchanged length manner. In this case, the length of each silicon wafer 1 is equal to the length of the square silicon wafer body, and a sum of widths of the plurality of silicon wafers 1 is equal to the width of the square silicon wafer body.

The silicon wafer 1 is a rectangular sheet, two electrodes are respectively disposed against two long sides of the silicon wafer 1, are spaced in a width direction of the silicon wafer 1, and extend along a length direction of the silicon wafer 1, and the side conductive member 3 is disposed on a side surface on one long side of the silicon wafer 1, that is, is disposed on a side surface on a side in the width direction of the silicon wafer 1. Therefore, the charge transmission path is shorter, the power of the photovoltaic cell 100 is higher, the photovoltaic cell 100 is manufactured more simply and conveniently, and it is more convenient to connect the photovoltaic cells 100.

Optionally, each of the two electrodes may be a rectangular sheet and have a length equal to the length of the silicon wafer 1, so that two broad sides and one long side of each electrode may be respectively aligned with two broad sides and one long side of the silicon wafer 1. Then, the space may be fully used, the power of the photovoltaic cell 100 is increased, and it is convenient to subsequently connect the photovoltaic cells 100. In addition, the side conductive member 3 may also be constructed to be sheet-shaped and fully occupy a side surface on a side in the width direction of the silicon wafer 1, thereby increasing the power of the photovoltaic cell 100. Certainly, specific structures of the side conductive member 3 and the electrode are not limited thereto. For example, the side conductive member 3 and the electrode may be further respectively formed into discrete electrodes by a plurality of sub-electrodes distributed at intervals.

Referring to Embodiment 1 to Embodiment 7 below, the two electrodes on each photovoltaic cell 100 are respectively a first electrode 4 electrically connected to the side conductive member 3 and a second electrode 5 not electrically connected to the side conductive member 3; and the silicon wafer 1 includes: a silicon substrate 11, a front first-type diffusion layer 12, and a back division layer 14, where a back surface of the silicon substrate 11 includes a first area and a second area, the front first-type diffusion layer 12 is disposed on a front surface of the silicon substrate 11, the front conductive member is disposed on the front first-type diffusion layer 12, the back division layer 14 is disposed on only and fully covers the first area, the first electrode 4 is disposed on the back division layer 14, and the second electrode 5 is disposed on the second area and is not in contact with the first electrode 4, where at least a part of the back division layer 14 is an insulation layer or a diffusion layer whose type is the same as that of the front first-type diffusion layer 12. Therefore, the photovoltaic cell 100 has a simple structure, and is manufactured and implemented conveniently.

Referring to Embodiment 1 to Embodiment 7 below, the silicon wafer 1 further includes: a side division layer 13, where the side division layer 13 is disposed on a side surface of the silicon substrate 11, the side conductive member 3 is disposed on the side division layer 13, and at least a part of the side division layer 13 is an insulation layer or a diffusion layer whose type is the same as that of the front first-type diffusion layer 12. Referring to Embodiment 1 below, each photovoltaic cell 100 further includes: a back electrical layer 60, where the back electrical layer 60 is disposed on the second area, and the second electrode 5 is disposed on the back electrical layer 60 and is electrically connected to the back electrical layer 60.

Referring to Embodiment 2 to Embodiment 7 below, each photovoltaic cell 100 further includes: a second back gate line layer 6, where the second back gate line layer 6 and the second electrode 5 are both disposed on the second area, and the second electrode 5 and the second back gate line layer 6 are electrically connected and are not superimposed on each other. Further, referring to Embodiment 2 to Embodiment 6 below, the silicon wafer 1 further includes a back second-type diffusion layer 15 whose type is different from that of the front first-type diffusion layer 12, the back second-type diffusion layer 15 is disposed on only and fully covers the second area, and the second back gate line layer 6 and the second electrode 5 are both disposed on the back second-type diffusion layer 15.

Referring to Embodiment 5 to Embodiment 7 below, each photovoltaic cell 100 further includes: a first back gate line layer 7, where the first back gate line layer 7 and the first electrode 4 are both disposed on the back division layer 14, and the first electrode 4 and the first back gate line layer 7 are electrically connected and are not superimposed on each other. Further, referring to Embodiment 5 to Embodiment 7 below, the back division layer 14 is a back first-type diffusion layer whose type is the same as that of the front first-type diffusion layer 12, the back first-type diffusion layer is disposed on only and fully covers the first area, and the first back gate line layer 7 and the first electrode 4 are both disposed on the back first-type diffusion layer.

Referring to Embodiment 1 to Embodiment 7 below, each of the first area and the second area is a non-discrete area. That is, when the first area is randomly divided into a plurality of sub-areas, the plurality of sub-areas may be all in communication with each other to form a continuous first area. When any layer is disposed on only and fully covers the first area, the any layer is also a non-discrete layer, that is, a continuous layer. When the second area is randomly divided into a plurality of sub-areas, the plurality of sub-areas may be all in communication with each other to form a continuous second area. When any layer is disposed on only and fully covers the second area, the any layer is also a non-discrete layer, that is, a continuous layer.

Referring to Embodiment 1 to Embodiment 4 below, each of the first area and the second area is a rectangular area to be manufactured conveniently. Referring to Embodiment 5 to Embodiment 7 below, the first area and the second area are distributed in a fingers-crossed shape. In this case, the first area includes a first communication area and a plurality of first dispersed areas, and the plurality of first dispersed areas is spaced in a length direction of the first communication area and each is in communication with the first communication area; and the second area includes a second communication area and a plurality of second dispersed areas, and the plurality of second dispersed areas is spaced in a length direction of the second communication area and each is in communication with the second communication area, where the first communication area and the second communication area are disposed in parallel, and the plurality of first dispersed areas and the plurality of second dispersed areas are alternated one by one between the first communication area and the second communication area.

Embodiment 1

Referring to FIG. 5 to FIG. 9, a photovoltaic cell 100 includes: a silicon wafer 1, a front conductive member, a side conductive member 3, a first electrode 4, a back electrical layer 60, and a second electrode 5, where the front conductive member is a front gate line layer 2, the silicon wafer 1 may include a silicon substrate 11, a front first-type diffusion layer 12, a side division layer 13, and a back division layer 14.

The silicon substrate 11 is sheet-shaped, and two surfaces of the silicon substrate 11 in a thickness direction are respectively a front surface and a back surface, and the front surface is connected to the back surface by using a side surface. The front first-type diffusion layer 12 is disposed on the front surface of the silicon substrate 11. For example, in an optional embodiment of the disclosure, the front first-type diffusion layer 12 fully covers the front surface of the silicon substrate 11, thereby reducing the manufacturing difficulty of the front first-type diffusion layer 12, increasing the manufacturing efficiency, and reducing the manufacturing costs.

The side division layer 13 is disposed on a side surface of the silicon substrate 11. For example, the side division layer 13 may be disposed on only one side surface of the silicon substrate 11, or may be disposed on a plurality of side surfaces. Optionally, the side division layer 13 is disposed on only one side surface of the silicon substrate 11 and fully covers the side surface. Therefore, it is convenient to manufacture and fabricate the side division layer 13.

The side conductive member 3 is disposed on the side division layer 13. That is, the side conductive member 3 may be directly or indirectly disposed on the side division layer 13. In this case, the side conductive member 3 is disposed on a side surface of the silicon wafer 1 and corresponds to the side division layer 13. That is, when being projected along a direction perpendicular to the side surface on which the side division layer 13 is located, the side conductive member 3 does not exceed the profile line of the side division layer 13.

The side conductive member 3 is disposed on the side surface of the silicon wafer 1, and is not embedded in the silicon wafer 1. Therefore, the entire manufacturing difficulty of the photovoltaic cell 100 may be reduced, the manufacturing process may be simplified, the manufacturing efficiency may be increased, and the manufacturing costs may be reduced.

The back surface of the silicon substrate 11 includes a first area and a second area, and the first area and the second area have no intersection set. The first area and the second area may be in contact with each other or be not in contact with each other. That is, the profile line of the first area and the profile line of the second area may be in contact with each other or be not in contact with each other. For example, when a part of the back division layer 14 in contact with the back electrical layer 60 is an insulation layer, the first area and the second area may be in contact with each other, and when a part of the back division layer 14 in contact with the back electrical layer 60 is a diffusion layer whose type is the same as that of the front first-type diffusion layer 12, the first area and the second area may be not in contact with each other. Each of the first area and the second area is a non-discrete area.

The back division layer 14 is disposed on only the first area. That is, a remaining surface on the back surface of the silicon substrate 11 other than the first area does not have the back division layer 14, and further, the back division layer 14 fully covers the first area. In this way, when the first area is a non-discrete continuous area, the back division layer 14 may be non-discretely, that is, continuously arranged on the silicon substrate 11. Therefore, the back division layer 14 is arranged on the silicon substrate 11 continuously, that is, non-discretely, and is not scattered on the silicon substrate 11 discretely, that is, discontinuously, for example, in a discrete form such as a scattered-point shape or a zebra shape. Therefore, the manufacturing difficulty of the back division layer 14 is greatly reduced, the manufacturing efficiency is increased, the manufacturing costs are reduced, and the power of the photovoltaic cell 100 may be effectively increased.

The front gate line layer 2 is disposed on the front first-type diffusion layer 12. That is, the front gate line layer 2 may be directly or indirectly disposed on the front first-type diffusion layer 12. In this case, the front gate line layer 2 is disposed on the front surface of the silicon wafer 1 and corresponds to the front first-type diffusion layer 12. In other words, when being projected along the thickness direction of the silicon wafer 1, the front gate line layer 2 does not exceed the profile line of the front first-type diffusion layer 12.

The silicon wafer 1 may further include an anti-reflection layer 101, and the anti-reflection layer 101 may be disposed on the front first-type diffusion layer 12. In this way, when the silicon wafer 1 includes the anti-reflection layer 101, the front gate line layer 2 may be directly disposed on the anti-reflection layer 101. However, when the silicon wafer 1 does not include the anti-reflection layer 101, the front gate line layer 2 may be directly disposed on the front first-type diffusion layer 12.

The first electrode 4 is disposed on the back division layer 14. That is, the first electrode 4 may be directly or indirectly disposed on the back division layer 14. In this case, the first electrode 4 is disposed on the back surface of the silicon wafer 1 and corresponds to the first area. In other words, when being projected along the thickness direction of the silicon wafer 1, the first electrode 4 does not exceed the first area. For example, the first electrode 4 may be further indirectly disposed on the back division layer 14 by using a passivation layer.

The back electrical layer 60 and the second electrode 5 are both disposed on the second area. That is, the back electrical layer 60 and the second electrode 5 may be directly or indirectly disposed on the second area on the back surface of the silicon substrate 11. In this case, the back electrical layer 60 and the second electrode 5 are disposed on the back surface of the silicon wafer 1 and correspond to the second area. That is, when being projected along the thickness direction of the silicon wafer 1, the back electrical layer 60 and the second electrode 5 do not exceed the second area. For example, the back electrical layer 60 and the second electrode 5 may be further indirectly disposed on the back surface of the silicon substrate 11 by using a passivation layer. The first electrode 4 is neither in contact with the back electrical layer 60, nor in contact with the second electrode 5.

In addition, it should be noted that, in some embodiments of the disclosure, the back electrical layer 60 and the second electrode 5 may be not superimposed on each other and are in contact connection with each other. In this case, the back electrical layer 60 and the second electrode 5 are respectively completely disposed on the back surface of the silicon wafer 1, are in direct contact with each other and are electrically connected to each other. Therefore, the space may be fully used, and the power of the photovoltaic cell 100 is increased. In some other embodiments of the disclosure, the back electrical layer 60 and the second electrode 5 may be further superimposed on each other. In this case, a union set surface obtained after the back electrical layer 60 and the second electrode 5 are superimposed is disposed on the back surface of the silicon wafer 1.

Herein, it should be noted that, when a conductive medium is disposed (directly or indirectly by using an anti-reflection layer or a passivation layer) on the front first-type diffusion layer 12, or is disposed (directly or indirectly by using an anti-reflection layer or a passivation layer) on a diffusion layer whose type is the same as that of the front first-type diffusion layer 12 (for example, a side first-type diffusion layer and a back first-type diffusion layer described below), a type of charges may be collected; and when a conductive medium is disposed (directly or indirectly by using a passivation layer) on a surface on the silicon substrate 11 that does not have the front first-type diffusion layer 12, or is disposed (directly or indirectly by using a passivation layer) on a diffusion layer whose type is opposite to that of the front first-type diffusion layer 12 (for example, a back second-type diffusion layer described below), another type of charges may be collected. Herein, it should be noted that, the principle in which a conductive medium collects charges from the silicon wafer should be well known to a person skilled in the art. Details are not described herein again.

In addition, it should be noted that, an outermost surface of each of the entire front surface and one side surface of the silicon wafer 1 in Embodiment 1 to Embodiment 7 herein may have an anti-reflection layer, and an outermost surface of the entire back surface of the silicon wafer 1 in Embodiment 2 to Embodiment 7 herein may further have a passivation layer, thereby facilitating manufacturing and fabrication. In addition, it should be noted that, concepts of the anti-reflection layer and the passivation layer described herein should be well known to a person skilled in the art, and the anti-reflection layer and the passivation layer mainly play a role of reducing reflection and strengthening charge collection. For example, materials of the anti-reflection layer and the passivation layer may include but are not limited to $TiO_2$, $Al_2O_3$, $SiN_xO_y$, and $SiN_xC_y$.

For example, when the silicon substrate 11 is made of P-type silicon, the front first-type diffusion layer 12 may be a phosphorus diffusion layer. In this case, a conductive medium disposed on the phosphorus diffusion layer may collect negative charges, and a conductive medium disposed on a non-phosphorus diffusion layer may collect positive charges. In this way, because the front gate line layer 2 is disposed (for example, directly disposed or indirectly disposed by using the anti-reflection layer 101) on the front first-type diffusion layer 12, the front gate line layer 2 may collect a first type of charges (for example, negative charges). The back electrical layer 60 is disposed (for example, directly disposed or indirectly disposed by using a passivation layer) on the back surface of the silicon substrate 11, so that the back electrical layer 60 may collect a second type of charges (for example, positive charges).

Specifically, the first electrode 4 is electrically connected to the front gate line layer 2 by using the side conductive member 3, so that the first type of charges (for example, negative charges) collected by the front gate line layer 2 may be transferred to the first electrode 4 (for example, the negative electrode); and the second electrode 5 is electrically connected to the back electrical layer 60, so that the second type of charges (for example, positive charges) collected by the back electrical layer 60 may be transferred to the second electrode 5 (for example, the positive electrode). Therefore, the first electrode 4 and the second electrode 5 may serve as the positive and negative electrodes of the photovoltaic cell 100 to output the electric energy. In addition, because the side conductive member 3 is disposed on a side surface of the silicon wafer 1, the front gate line layer 2 may be effectively electrically connected to the first electrode 4 simply and conveniently by using the side conductive member 3, thereby ensuring the operating reliability of the photovoltaic cell 100.

A person skilled in the art may understand that, the first electrode 4 and the second electrode 5 need to be electrodes whose polarities are opposite, and need to be insulated from each other, that is, not conductively connected to each other, or not electrically connected to each other. In this case, the first electrode 4, all components and the second electrode 5 electrically connected to the first electrode 4, and all components electrically connected to the second electrode 5 cannot be directly conductively connected, and cannot be indirectly conductively connected by using any external conductive medium either, for example, may be not in contact with each other or be isolated by using an insulation material, thereby preventing the first electrode 4 and the second electrode 5 from being short-circuited.

The back division layer 14 is constructed to prevent the first electrode 4 and the second electrode 5 from being short-circuited by using the silicon substrate 11, that is, to prevent the first electrode 4 and the silicon substrate 11 from being in direct contact with each other to cause short-circuit. For example, the back division layer 14 may be a diffusion layer whose type is the same as that of the front diffusion layer, and/or an insulation layer. That is, the back division layer 14 may be completely a diffusion layer whose type is the same as that of the front diffusion layer, or may be completely an insulation layer, or a part of the back division layer 14 may be a diffusion layer whose type is the same as that of the front diffusion layer, and a remaining part is an insulation layer. When the first electrode 4 is disposed on the silicon substrate 11 by using the insulation layer, the first electrode 4 may be directly insulated from the silicon substrate 11, to prevent the first electrode 4 from collecting, from the silicon substrate 11, charges whose type is the same as that of charges collected by the second electrode 5, thereby effectively preventing the first electrode 4 from being conductively connected to the second electrode 5 by using the silicon substrate 11 to cause short-circuit, that is, preventing the first electrode 4 and the silicon substrate 11 from being in direct contact with each other to cause short-circuit.

When the first electrode 4 is disposed on the silicon substrate 11 by using a diffusion layer whose type is the same as that of the front diffusion layer, the first electrode 4 may collect, from the diffused silicon substrate 11, charges whose type is the same as that of charges collected by the front gate line layer 2, that is, charges whose type is opposite to that of charges collected by the second electrode 5, thereby also preventing the first electrode 4 and the second electrode 5 from being short-circuited, and increasing the power of the photovoltaic cell 100.

The side division layer 13 is constructed to prevent the side conductive member 3 and the second electrode 5 from being short-circuited by using the silicon substrate 11, thereby preventing the first electrode 4 and the second electrode 5 from being short-circuited, that is, preventing the side conductive member 3 and the silicon substrate 11 from being in direct contact with each other to cause short-circuit. For example, the side division layer 13 may be a diffusion layer whose type is the same as that of the front diffusion layer, and/or an insulation layer. That is, the side division layer 13 may be completely a diffusion layer whose type is the same as that of the front diffusion layer, or may be completely an insulation layer, or a part of the back division layer 14 may be a diffusion layer whose type is the same as that of the front diffusion layer, and a remaining part is an insulation layer.

When the side conductive member 3 is disposed on the silicon substrate 11 by using the insulation layer, the side conductive member 3 may be directly insulated from the silicon substrate 11, to prevent the side conductive member 3 from collecting, from the silicon substrate 11, charges whose type is the same as that of charges collected by the second electrode 5, thereby effectively preventing the side conductive member 3 from being conductively connected to the second electrode 5 by using the silicon substrate 11 to cause short-circuit, that is, preventing the side conductive member 3 and the silicon substrate 11 from being in direct contact with each other to cause short-circuit.

When the side conductive member 3 is disposed on the silicon substrate 11 by using a diffusion layer whose type is the same as that of the front diffusion layer, the side conductive member 3 may collect, from the diffused silicon substrate 11, charges whose type is the same as that of charges collected by the front gate line layer 2, that is, charges whose type is opposite to that of charges collected by the second electrode 5, thereby also preventing the side conductive member 3 and the second electrode 5 from being short-circuited, that is, preventing the side conductive member 3 and the silicon substrate 11 from being in direct contact with each other to cause short-circuit, and increasing the power of the photovoltaic cell 100.

Specifically, in an embodiment of the disclosure, at least a part of at least one of the side division layer 13 and the back division layer 14 is a diffusion layer whose type is the same as that of the front first-type diffusion layer 12. That is, either at least a part of the side division layer 13 is a diffusion layer whose type is the same as that of the front first-type diffusion layer 12, or at least a part of the back division layer 14 is a diffusion layer whose type is the same as that of the front first-type diffusion layer 12, thereby not only ensuring the insulation effect of the first electrode 4 and the second electrode 5, but also increasing the power of the photovoltaic cell 100.

Optionally, the back division layer 14 is completely a diffusion layer whose type is the same as that of the front first-type diffusion layer 12, that is, the back division layer 14 is a first back diffusion layer fully covering the first area. Therefore, manufacturing is facilitated and insulation reliability is good. Optionally, the side division layer 13 is completely a diffusion layer whose type is the same as that of the front first-type diffusion layer 12, that is, the side division layer 13 is a side diffusion layer fully covering the side surface of the silicon substrate 11. Therefore, manufacturing is facilitated and insulation reliability is good.

Herein, it should be noted that, concepts such as the silicon substrate, the diffusion layer, the anti-reflection layer, and the passivation layer, and the principle in which a conductive medium collects charges from the silicon wafer are all well known to a person skilled in the art. Details are not described herein again.

In addition, in an optional embodiment of the disclosure, each of the front gate line layer 2, and the second back gate line layer 6 and the first back gate line layer 7 described below may be a conductive dielectric layer formed by a plurality of conductive fine gate lines disposed at intervals, where the fine gate line may be made of a silver material. Therefore, on one hand, the conductive rate may be increased, and on the other hand, the light shielding area may be shrunk, thereby increasing the power of the photovoltaic cell 100 in disguised form. The back electrical layer 60 may be an aluminum layer, that is, an aluminum back-surface field. Therefore, on one hand, the conductive rate may be increased, and on the other hand, the costs may be reduced.

To sum up, in the photovoltaic cell 100 according to this embodiment of the disclosure, because at least a part of at least one of the back division layer 14 and the side division layer 13 is a diffusion layer whose type is the same as that of the front first-type diffusion layer 12, not but insulation between the first electrode 4 and the second electrode 5 may be ensured, but also the power of the photovoltaic cell 100 may be effectively increased.

Moreover, by disposing the side conductive member 3 on the side surface of the silicon substrate 11, the first electrode on the front surface of the existing photovoltaic cell may be migrated from the front side of the silicon wafer to the back side, so as to prevent the first electrode from performing light shielding on the front side of the silicon wafer. Therefore, compared with the existing photovoltaic cell, the power of the photovoltaic cell 100 of the disclosure is higher. Moreover, the first electrode 4 and the second electrode 5 of the photovoltaic cell 100 of the disclosure are located on a same side of the silicon wafer 1, thereby facilitating electrical connection between a plurality of photovoltaic cells 100, reducing the welding difficulty, reducing the solder use amount, and also reducing the damage probability of the photovoltaic cell 100 during welding and in the subsequent lamination process.

In addition, the side conductive member 3 is disposed on the side surface of the silicon wafer 1, thereby greatly reducing the manufacturing difficulty of the photovoltaic cell 100 (for example, manufacturing processes such as manufacturing a hole on the silicon wafer 1 and injecting a conductive medium into the hole are not required), and then improving the manufacturing rate and reducing the manufacturing failure rate and the manufacturing costs. In addition, when the side conductive member 3 is disposed on a side surface on a side in the width direction of the silicon substrate 11, the path of transferring charges from the front side of the silicon wafer 1 to the back side may be effectively shortened, to improve the charge transfer rate, thereby increasing the power of the photovoltaic cell 100 in disguised form.

Optionally, when the first area and the second area are each a non-discrete area, have no intersection set, and are not in contact with each other, and the silicon wafer 1 is a rectangular sheet, the first area and the second area may each be a rectangular area and be arranged at an interval in the width direction of the silicon wafer 1. The first electrode 4 whose area is relatively large and the back electrical layer 60 may be manufactured. Optionally, when being projected along the thickness direction of the silicon wafer 1, an outer edge of the first electrode 4 falls on the profile line of the first area, the back electrical layer 60 fully covers the second area, and the second electrode 5 is disposed on the back electrical layer 60. Therefore, the first area and the second area may be maximally used, to increase the power of the photovoltaic cell 100. Herein, it should be noted that, for a planar component (for example, the rectangular sheet-shaped first electrode 4 and second electrode 5 described herein), the "outer edge" is the profile line of the planar component, and for a linear component (for example, the fine gate line described herein), the "outer edge" is two endpoints of the linear component.

The front gate line layer 2 includes a plurality of front secondary gate line layers 21 extending perpendicular to the length direction of the side conductive member 3. That is, each front secondary gate line layer 21 is perpendicular to the length direction of the side conductive member 3. Therefore, the charge transmission path of the front secondary gate line layer 21 may be shortened, thereby improving the charge transmission efficiency, and increasing the power of the photovoltaic cell 100.

The method for preparing a photovoltaic cell 100 according to Embodiment 1 is briefly described below.

Step a1. Averagely divide and cut, by using laser, a square regular silicon substrate body (for example, a regular silicon substrate whose specification is 156 mm*156 mm) into 3 to 15 (optionally, 5 to 10) rectangular sheet-shaped silicon substrates 11 whose lengths are unchanged (for example, each of the lengths is 156 mm), and then perform a subsequent process of manufacturing a photovoltaic cell 100. Certainly, the disclosure is not limited thereto, and the rectangular sheet-shaped silicon substrate 11 may be further obtained by using another manner or process. Herein, it should be noted that, the square regular silicon substrate body is optionally averagely divided into three portions or more than three portions, thereby shortening a distance by which charges are migrated from a front surface to a back surface, so that the charges are collected efficiently and easily, thereby increasing the power of the photovoltaic cell 100; and when the square regular silicon substrate body is averagely divided into 15 portions or less than 15 portions, cutting and manufacturing are easy, and a relatively small amount of solder is consumed when photovoltaic cells 100 are connected in series or connected in parallel subsequently, thereby improving the entire power of the photovoltaic cells 100 after being connected in series or connected in parallel, and reducing the costs.

Step a2. Perform cleaning and texturizing: cleaning removes dirt on each surface of the silicon substrate 11, and texturizing reduces the reflectivity of each surface of the silicon substrate 11.

Step a3. Perform diffusion and junction preparation: double-sided diffusion is performed on the silicon substrate 11 by using a diffusion furnace to prepare a P-N junction, so that each surface of the silicon substrate 11 has a same type of diffusion layer Step a4. Perform mask protection: a diffusion layer (that is, used as a back diffusion layer 14) on a first area and a diffusion layer (that is, used as a side diffusion layer 13) on a side surface adjacent to the first area are protected by using paraffin.

Step a5. Perform etching: back junctions that are not protected by paraffin and that are on a side surface and a back surface of the silicon substrate 11 are removed Step a6. Remove paraffin protection, and remove phosphosilicate glass, thereby obtaining the back diffusion layer 14 and the side diffusion layer 13 protected by paraffin.

Step a7. Evaporate an anti-reflection layer 101 on a front diffusion layer 12, where materials of the anti-reflection layer 101 include but are not limited to TiO2, Al2O3, SiNxOy, and SiNxCy.

Step a8. Screen-print a back electrical layer 60 along a length direction on a second area, screen-print a second electrode 5 along the length direction on the back electrical layer 60, screen-print a first electrode 4 along the length direction on the back diffusion layer 14, and perform drying, where the first electrode 4 exactly coincides with the back diffusion layer 14, and a safe distance exists between the back electrical layer 60 and the first electrode 4, to prevent short-circuit.

Step a9. Screen-print a gate line layer 2 along a width direction on the front diffusion layer 12 to enable each secondary gate line 21 in the gate line layer 2 to be perpendicular to the second electrode 5, and perform drying.

Step a10. Screen-print a side conductive member 3 along the length direction on the side diffusion layer 13, and perform drying.

Embodiment 2

Referring to FIG. 10 to FIG. 14, the structure of Embodiment 2 is roughly the same as that of Embodiment 1, where a same component has a same reference numeral in the accompanying drawings, and only a difference is as follows:

In Embodiment 1, the back electrical layer 60 is disposed on the second area, and the second electrode 5 is disposed on the back electrical layer 60; but in Embodiment 2, a back second-type diffusion layer 15 is disposed on a second area, and a second back gate line layer 6 and a second electrode 5 are disposed on the back second-type diffusion layer 15.

A photovoltaic cell 100 includes: a silicon wafer 1, a front conductive member, a side conductive member 3, a first electrode 4, a second back gate line layer 6, and a second electrode 5, where the front conductive member is a front gate line layer 2, the silicon wafer 1 may include a silicon substrate 11, a front first-type diffusion layer 12, a back second-type diffusion layer 15, a side division layer 13, and a back division layer 14, where the side division layer 13 may be a side diffusion layer whose type is the same as that of the front first-type diffusion layer 12, and the back division layer 14 may be a back first-type diffusion layer whose type is the same as that of the front first-type diffusion layer 12. The back second-type diffusion layer 15 includes a plurality of second back secondary gate line layers 61 extending perpendicular to a length direction of the second electrode 5. That is, each second back secondary gate line layer 61 is perpendicular to the length direction of the second electrode 5. Therefore, the charge transmission path of the second back secondary gate line layer 61 may be shortened, thereby improving the charge transmission efficiency, and increasing the power of the photovoltaic cell 100.

Specifically, a back surface of the silicon substrate 11 includes a first area and a second area, and the first area and the second area have no intersection set and are not in contact with each other. That is, the profile line of the first area and the profile line of the second area are not in contact with each other.

The back first-type diffusion layer is disposed on only the first area. That is, a remaining surface on the back surface of the silicon substrate 11 other than the first area does not have the back first-type diffusion layer, and further, the back first-type diffusion layer fully covers the first area. In this way, when the first area is a non-discrete continuous area, the back first-type diffusion layer may be non-discretely, that is, continuously arranged on the silicon substrate 11. Therefore, the back first-type diffusion layer is arranged on the silicon substrate 11 continuously, that is, non-discretely, and is not scattered on the silicon substrate 11 discretely, that is, discontinuously, for example, in a discrete form such as a scattered-point shape or a zebra shape. Therefore, the manufacturing difficulty of the back first-type diffusion layer is greatly reduced, the manufacturing efficiency is increased, the manufacturing costs are reduced, and the power of the photovoltaic cell 100 may be effectively increased.

The back second-type diffusion layer 15 is disposed on only the second area. That is, a remaining surface on the back surface of the silicon substrate 11 other than the second area does not have the back second-type diffusion layer 15. Further, the back second-type diffusion layer 15 fully covers the second area. In this way, when the second area is a non-discrete continuous area, the back second-type diffusion layer 15 may be non-discretely, that is, continuously arranged on the silicon substrate 11. Therefore, the back second-type diffusion layer 15 is arranged on the silicon substrate 11 continuously, that is, non-discretely, and is not scattered on the silicon substrate 11 discretely, that is, discontinuously, for example, in a discrete form such as a scattered-point shape or a zebra shape. Therefore, the manufacturing difficulty of the back second-type diffusion layer 15 is greatly reduced, the manufacturing efficiency is increased, the manufacturing costs are reduced, and the power of the photovoltaic cell 100 may be effectively increased.

The first electrode 4 is disposed on the back first-type diffusion layer. That is, the first electrode 4 may be directly or indirectly disposed on the back first-type diffusion layer. In this case, the first electrode 4 is disposed on the back surface of the silicon wafer 1 and corresponds to the first area. That is, when being projected along the thickness direction of the silicon wafer 1, the first electrode 4 does not exceed the first area. The silicon wafer 1 may further include a passivation layer 102, and the passivation layer 102 may be disposed on the back first-type diffusion layer. In this way, when the silicon wafer 1 includes the passivation layer 102, the first electrode 4 may be directly disposed on the passivation layer 102. In some embodiments of the disclosure, when the silicon wafer 1 does not include the passivation layer 102, the first electrode 4 may be directly disposed on the back first-type diffusion layer.

The second back gate line layer 6 and the second electrode 5 are both disposed on the back second-type diffusion layer 15. That is, the second back gate line layer 6 and the second electrode 5 may be directly or indirectly disposed on the back second-type diffusion layer 15. In this case, the second back gate line layer 6 and the second electrode 5 are disposed on the back surface of the silicon wafer 1 and correspond to the second area. That is, when being projected along the thickness direction of the silicon wafer 1, the second back gate line layer 6 and the second electrode 5 do not exceed the second area. The first electrode 4 is neither in contact with the second back gate line layer 6, nor in contact with the second electrode 5.

For example, the silicon wafer 1 may further include a passivation layer 102, and the passivation layer 102 may be disposed on the back second-type diffusion layer 15. In this way, when the silicon wafer 1 includes the passivation layer 102, the second back gate line layer 6 and the second electrode 5 may be directly disposed on the passivation layer 102. When the silicon wafer 1 does not include the passivation layer 102, the second back gate line layer 6 and the second electrode 5 may be directly disposed on the back second-type diffusion layer 15.

In addition, it should be noted that, in some embodiments of the disclosure, the second back gate line layer 6 and the second electrode 5 may be not superimposed on each other and are in contact connection with each other. In this case, the second back gate line layer 6 and the second electrode 5 are respectively completely disposed on the back surface of the silicon wafer 1, and edges are in direct contact with each other and are electrically connected to each other. Therefore, the space may be fully used, and the power of the photovoltaic cell 100 is increased. In some other embodiments of the disclosure, the second back gate line layer 6 and the second electrode 5 may be further superimposed on each other. In this case, a union set surface obtained after the second back gate line layer 6 and the second electrode 5 are superimposed is disposed on the back surface of the silicon wafer 1.

Because the first area and the second area have no intersection set and are not in contact with each other, the first electrode 4 whose area is relatively large may be manufactured, and the second back gate line layer 6 whose area is relatively large and the second electrode 5 may be manufactured. Optionally, when being projected along the thickness direction of the silicon wafer 1, an outer edge of the first electrode 4 falls on the profile line of the first area, and an entire outer edge of each of the second back gate line layer 6 and the second electrode 5 falls on the profile line of the second area. Therefore, the first area and the second area may be maximally used, to increase the power of the photovoltaic cell 100.

Herein, it should be noted that, "the first-type diffusion layer" and "the second-type diffusion layer" described herein are two diffusion layers of different types, and when a conductive medium is disposed (for example, directly disposed or indirectly disposed by using the anti-reflection layer or passivation layer described herein) on the first-type diffusion layer and the second-type diffusion layer, different types of charges may be collected. In addition, it should be noted that, concepts of the anti-reflection layer and the passivation layer described herein are well known to a person skilled in the art, and the anti-reflection layer and the passivation layer mainly play a role of reducing reflection and strengthening charge collection.

Therefore, the front first-type diffusion layer, the back first-type diffusion layer, and the side first-type diffusion layer described herein in "the first-type diffusion layer" are a same type of diffusion layer, and when a conductive medium is disposed on the first-type diffusion layer, a first type of charges may be collected; and the back second-type diffusion layer in "the second-type diffusion layer" is another type of diffusion layer, and when a conductive medium is disposed on the second-type diffusion layer, a second type of charges may be collected. Herein, it should be noted that, the principle in which a conductive medium collects charges from the silicon wafer should be well known to a person skilled in the art. Details are not described herein again.

For example, when the silicon substrate 11 is made of P-type silicon, the first-type diffusion layer may be a phosphorus diffusion layer. In this case, a conductive medium disposed on the phosphorus diffusion layer may collect negative charges. The second-type diffusion layer may be a boron diffusion layer, and a conductive medium disposed on the boron diffusion layer may collect positive charges. For another example, when the silicon substrate 11 is made of N-type silicon, "the first-type diffusion layer" may be a boron diffusion layer, and "the second-type diffusion layer" may be a phosphorus diffusion layer. Details are not described herein again.

In this way, because the front gate line layer 2 is disposed (for example, directly disposed or indirectly disposed by using the anti-reflection layer 101) on the first-type diffusion layer, the front gate line layer 2 may collect the first type of charges (for example, negative charges). The second back gate line layer 6 is disposed (for example, directly disposed or indirectly disposed by using the passivation layer 102) on the second-type diffusion layer, so that the second back gate line layer 6 may collect the second type of charges (for example, positive charges).

Specifically, the first electrode 4 is electrically connected to the front gate line layer 2 by using the side conductive member 3, so that the first type of charges (for example, negative charges) collected by the front gate line layer 2 may be transferred to the first electrode 4 (for example, the negative electrode); and the second electrode 5 is electrically connected to the second back gate line layer 6, so that the second type of charges (for example, positive charges) collected by the second back gate line layer 6 may be transferred to the second electrode 5 (for example, the positive electrode). Therefore, the first electrode 4 and the second electrode 5 may serve as the positive and negative electrodes of the photovoltaic cell 100 to output the electric energy.

In this way, the first electrode 4 may collect the first type of charges by using the front gate line layer 2 located on the front side of the silicon wafer 1, and the second electrode 5 may collect the second type of charges by using the second back gate line layer 6 located on the back side of the silicon wafer 1, thereby effectively improving the space utilization, and further increasing the power of the photovoltaic cell 100. Therefore, the photovoltaic cell 100 may become an aesthetic and efficient double-sided cell.

Specifically, the method for preparing a photovoltaic cell 100 in Embodiment 2 is roughly the same as the method for preparing a photovoltaic cell 100 in Embodiment 1, and a difference is as follows: When the silicon wafer 1 in Embodiment 2 is prepared, different types of double-sided diffusion are performed on the silicon substrate 11, that is, the front surface and the back surface of the silicon substrate 11 are respectively diffused to obtain different types of diffusion layers, and the diffusion layer on the front surface extends from a side surface of the silicon substrate 11 to the back surface of the silicon substrate 11, so as to obtain the front first-type diffusion layer 12, the side first-type diffusion layer 13, and the back first-type diffusion layer 14, then the passivation layer 102 whose material is the same as that of the anti-reflection layer 101 is evaporated on the back first-type diffusion layer 14, the back second-type diffusion layer 15, and the silicon substrate 11, and then the second back gate line layer 6 is screen-printed on the passivation layer 102.

Embodiment 3

Referring to FIG. 15 to FIG. 19, the structure of Embodiment 3 is roughly the same as that of Embodiment 2, where a same component has a same reference numeral in the accompanying drawings, and only a difference is as follows: In Embodiment 2, the first area and the second area have no intersection set and are not in contact with each other, but in Embodiment 3, a first area and a second area have no intersection set and are in contact with each other. That is, the profile line of the first area and the profile line of the second area are in contact with each other.

Specifically, the first area and the second area have no intersection set and are in contact with each other, and a first electrode 4 is disposed on the first area. That is, the first electrode 4 may be directly or indirectly disposed on the first area. In this case, the first electrode 4 is disposed on the back surface of the silicon wafer 1 and corresponds to the first area. That is, when being projected along the thickness direction of the silicon wafer 1, the first electrode 4 does not exceed the first area and is located beyond the second area. Each of a second back gate line layer 6 and a second electrode 5 is disposed on the second area and is not in contact with the first electrode 4. That is, the second back gate line layer 6 and the second electrode 5 may be directly or indirectly disposed on the second area. Moreover, the second back gate line layer 6 is not in contact with the first electrode 4, and the second electrode 5 is not in contact with the first electrode 4 either. In this case, the second back gate line layer 6 and the second electrode 5 are disposed on the back surface of the silicon wafer 1 and correspond to the second area. That is, when being projected along the thickness direction of the silicon wafer 1, the second back gate line layer 6 and the second electrode 5 do not exceed the second area and is located beyond the first area. Therefore, short-circuit caused by the first electrode 4 being in contact with the second electrode 5 may be effectively avoided.

Embodiment 4

Referring to FIG. 20 to FIG. 24, the structure of Embodiment 4 is roughly the same as that of Embodiment 3, where a same component has a same reference numeral in the accompanying drawings, and only a difference is as follows: In Embodiment 3, the side division layer 13 is a side first-type diffusion layer, and the back division layer 14 is a back first-type diffusion layer, but in Embodiment 4, each of a side division layer 13 and a back division layer 14 is an insulation layer.

Specifically, the method for preparing a photovoltaic cell 100 in Embodiment 4 is roughly the same as the method for preparing a photovoltaic cell 100 in Embodiment 2, and a difference is as follows: When the silicon wafer 1 in Embodiment 4 is prepared, different types of double-sided diffusion are performed on the silicon substrate 11, that is, the front surface and the back surface of the silicon substrate 11 are respectively diffused to obtain different types of diffusion layers, so as to obtain the front first-type diffusion layer 12 and the back second-type diffusion layer 15, and insulation layers are manufactured on a side of the back surface of the silicon substrate 11 and a side surface adjacent to the side, so as to obtain the back division layer 14 and the side division layer 13.

Embodiment 5

Referring to FIG. 25 to FIG. 31, the structure of Embodiment 5 is roughly the same as that of Embodiment 3, where a same component has a same reference numeral in the accompanying drawings, and only a difference is as follows: First: in Embodiment 3, only the first electrode 4 is disposed on the back first-type diffusion layer (that is, the back division layer 14), but in Embodiment 5, the first back gate line layer 7 electrically connected to the first electrode 4 is further disposed on the back first-type diffusion layer (that is, the back division layer 14). Second: in Embodiment 5, the first area and the second area are distributed in a contact-type fingers-crossed shape.

The first back gate line layer 7 and the first electrode 4 are disposed on the back first-type diffusion layer. That is, the first back gate line layer and the first electrode 4 may be directly or indirectly disposed on the back first-type diffusion layer. In this case, the first back gate line layer 7 and the first electrode 4 are disposed on the back surface of the silicon wafer 1 and correspond to the first area. That is, when being projected along the thickness direction of the silicon wafer 1, the first back gate line layer 7 and the first electrode 4 do not exceed the first area and is located beyond the second area.

For example, the silicon wafer 1 may further include a passivation layer 102, and the passivation layer 102 may be disposed on the back first-type diffusion layer. In this way, when the silicon wafer 1 includes the passivation layer 102, the first back gate line layer 7 and the first electrode 4 may be directly disposed on the passivation layer 102. When the silicon wafer 1 does not include the passivation layer 102, the first back gate line layer 7 and the first electrode 4 may be directly disposed on the back first-type diffusion layer.

In addition, it should be noted that, in some embodiments of the disclosure, the first back gate line layer 7 and the first electrode 4 may be not superimposed on each other and are in contact connection with each other. In this case, the first back gate line layer 7 and the first electrode 4 are respectively completely disposed on the back surface of the silicon wafer 1, and edges are in direct contact with each other and are electrically connected to each other. Therefore, the space may be fully used, and the power of the photovoltaic cell 100 is increased. In some other embodiments of the disclosure, the first back gate line layer 7 and the first electrode 4 may be further superimposed on each other. In this case, a union set surface obtained after the first back gate line layer 7 and the first electrode 4 are superimposed is disposed on the back surface of the silicon wafer 1.

Therefore, in the photovoltaic cell 100 according to this embodiment, the front gate line layer 2 and the first back gate line layer 7 that are connected to the first electrode 4 are respectively manufactured on the front surface and the back surface of the silicon wafer 1, and the second back gate line layer 6 connected to the second electrode 5 is manufactured on the back surface of the silicon wafer 1, so that the photovoltaic cell 100 may be a double-sided cell, and the power is higher.

The first area and the second area are distributed in a contact-type fingers-crossed shape. That is, the profile line of the first area and the profile line of the second area are in contact with each other. For example, the first area and the second area may be completely seamlessly interconnected, to form a continuous, complete, and holeless non-discrete area. For example, optionally, the first area and the second area may fully cover the back surface of the silicon substrate 11. Therefore, the space may be fully used, and the power of the photovoltaic cell 100 is increased. Herein, it should be noted that, the "fingers-crossed shape" is a shape similar to that fingers of left and right hands cross each other and do not overlap.

Specifically, the first area includes a first communication area and a plurality of first dispersed areas, and the plurality of first dispersed areas is spaced in a length direction of the first communication area and each is in communication with the first communication area; and the second area includes a second communication area and a plurality of second dispersed areas, and the plurality of second dispersed areas is spaced in a length direction of the second communication area and each is in communication with the second communication area.

Quantities of the plurality of first dispersed areas and the plurality of second dispersed areas are not limited, and shapes of the first communication area, the plurality of first dispersed areas, the second communication area, and the plurality of second dispersed areas are not limited. For example, the plurality of first dispersed areas and the plurality of second dispersed areas may each be formed into a triangle, a semi-circle, a rectangle, or the like, and the plurality of first dispersed areas and the plurality of second dispersed areas may be formed into a rectangle, a wave strip shape, or the like.

The first communication area and the second communication area are disposed opposite to each other. For example, the first communication area and the second communication area disposed in parallel to each other or roughly in parallel to each other (having a relatively small angle), and the plurality of first dispersed areas and the plurality of second dispersed areas are alternated one by one between the first communication area and the second communication area. That is, a first dispersed area, a second dispersed area, another first dispersed area, another second dispersed area, and so on are sequentially arranged along the length direction of the first communication area, that is, along the length direction of the second communication area, and the plurality of first dispersed areas and the plurality of second dispersed areas are alternated one by one and crossed alternately.

The profile line of the first communication area is in contact with profile lines of the plurality of second dispersed areas, and the profile line of the second communication area is in contact with profile lines of the plurality of first dispersed areas. Therefore, it may be ensured that the first area and the second area are arranged in a contact-type fingers-crossed shape.

Further, the first electrode 4 is disposed on the first communication area, and the first back gate line layer 7 is disposed on the plurality of first dispersed areas. In other words, the first electrode 4 is disposed corresponding to the first communication area, and the first back gate line layer 7 is disposed corresponding to the plurality of first dispersed areas. That is, when being projected along the thickness direction of the silicon wafer 1, the first electrode 4 does not exceed the profile line of the first communication area, and the first back gate line layer 7 does not exceed the profile lines of the plurality of first dispersed areas and is located beyond the profile line of the second area. Therefore, the first electrode 4 and the first back gate line layer 7 are deployed properly and simply, and are manufactured on the back first-type diffusion layer conveniently.

Optionally, the first back gate line layer 7 includes a plurality of first back secondary gate line layer 71 that extends perpendicular to the length direction of the first communication area and that is spaced in the length direction of the first communication area. Therefore, the first back gate line layer 7 may transfer collected charges to the first electrode 4 on a shorter path, thereby improving the charge transfer efficiency, and increasing the power of the photovoltaic cell 100.

Further, the second electrode 5 is disposed on the second communication area, and the second back gate line layer 6 is disposed on the plurality of second dispersed areas. In other words, the second electrode 5 is disposed corresponding to the second communication area, and the second back gate line layer 6 is disposed corresponding to the plurality of second dispersed areas. That is, when being projected along the thickness direction of the silicon wafer 1, the second electrode 5 does not exceed the profile line of the second communication area, and the second back gate line layer 6 does not exceed the profile lines of the plurality of second dispersed areas and is located beyond the profile line of the first area. Therefore, the second electrode 5 and the second back gate line layer 6 are deployed properly and simply, and are manufactured on the back second-type diffusion layer 15 conveniently.

Optionally, the second back gate line layer 6 includes a plurality of second back secondary gate line layer 61 that extends perpendicular to the length direction of the second communication area and that is spaced in the length direction of the second communication area. Therefore, the second back gate line layer 6 may transfer collected charges to the second electrode 5 on a shorter path, thereby improving the charge transfer efficiency, and increasing the power of the photovoltaic cell 100.

The profile line of each first back secondary gate line layer 71 is not in contact with each of the second communication area and the plurality of second dispersed areas. That is, each first back secondary gate line layer 71 is not in contact with each of the second back secondary gate line layer 61 and the second electrode 5. The profile line of each second back secondary gate line layer 61 is not in contact with each of the first communication area and the plurality of first dispersed areas. That is, each second back secondary gate line layer 61 is not in contact with each of the first back secondary gate line layer 71 and the first electrode 4.

Specifically, the method for preparing a photovoltaic cell 100 in Embodiment 5 is roughly the same as the method for preparing a photovoltaic cell 100 in Embodiment 2, and a difference is as follows: After the silicon wafer 1 is prepared completely, the second back secondary gate line layer 61 is manufactured on the back second-type diffusion layer 15.

Embodiment 6

Referring to FIG. 32 to FIG. 38, the structure of Embodiment 6 is roughly the same as that of Embodiment 5, where a same component has a same reference numeral in the accompanying drawings, and only a difference is as follows: In Embodiment 5, the first area and the second area are distributed in a contact-type fingers-crossed shape, but in Embodiment 6, a first area and a second area are distributed in a non-contact-type fingers-crossed shape.

The profile line of the first communication area is not in contact with each of the profile line of the second communication area and the profile lines of the plurality of second dispersed areas, and the profile line of the second communication area is not in contact with each of the profile line of the first communication area and the profile lines of the plurality of first dispersed areas. Therefore, it may be ensured that the first area and the second area are arranged in a non-contact-type fingers-crossed shape. The profile line of each first back secondary gate line layer 71 is not in contact with each of the second communication area and the second dispersed areas. That is, each first back secondary gate line layer 71 is not in contact with each of the second back secondary gate line layer 61 and the second electrode 5. The profile line of each second back secondary gate line layer 61 is not in contact with each of the first communication area and the first dispersed areas. That is, each second back secondary gate line layer 61 is not in contact with each of the first back secondary gate line layer 71 and the first electrode 4.

Embodiment 7

Referring to FIG. 39 to FIG. 45, the structure of Embodiment 7 is roughly the same as that of Embodiment 5, where a same component has a same reference numeral in the accompanying drawings, and only a difference is as follows: In Embodiment 5, the second area is fully covered by the back second-type diffusion layer 15, but in Embodiment 7, the second-type diffusion layer is not disposed on the second area.

The second electrode 5 and the second back gate line layer 6 may be directly or indirectly disposed on the second area. For example, the second area may be fully covered by a passivation layer 102, and the second back gate line layer 6 and the second electrode 5 may be directly disposed on the passivation layer 102. When the silicon wafer 1 does not include the passivation layer 102, the second back gate line layer 6 and the second electrode 5 may be directly disposed on the second area.

In the description of the present utility model, it should be understood that orientation or position relationships indicated by the terms such as "on", "below", "front", and "back" are based on orientation or position relationships shown in the accompanying drawings, and are used only for ease and brevity of illustration and description, rather than indicating or implying that the mentioned apparatus or component need to have a particular orientation or need to be constructed and operated in a particular orientation. Therefore, such terms should not be construed as limiting of the present utility model.

In the present utility model, unless specified or limited otherwise, the terms "mounted", "connected", "coupled", and "fixed" should be understood broadly, for example, which may be direct connections, indirectly connected with each other through an intermediate medium, or communication inside two elements or an interaction relationship between two elements. A person of ordinary skill in the art can understand specific meanings of the terms in the present utility model according to specific situations. In the present utility model, unless explicitly specified or limited otherwise, a first characteristic "on" or "under" a second characteristic may be the first characteristic in direct contact with the second characteristic, or the first characteristic in indirect contact with the second characteristic by using an intermediate medium.

In the descriptions of this specification, a description of a reference term such as "an embodiment", "some embodiments", "an example", "a specific example", or "some examples" means that a specific feature, structure, material, or characteristic that is described with reference to the embodiment or the example is included in at least one embodiment or example of the present utility model. In this specification, exemplary descriptions of the foregoing terms do not necessarily refer to a same embodiment or example. In addition, the described specific feature, structure, material, or characteristic may be combined in a proper manner in any one or more embodiments or examples. In addition, with no conflict, a person skilled in the art can integrate and combine different embodiments or examples and features of the different embodiments and examples described in this specification.

Although the embodiments of the present utility model have been shown and described, a person skilled in the art can understand that the above embodiments cannot be construed to limit the present utility model, and changes, alternatives, and modifications can be made in the embodiments without departing from the principle and the purpose of the present utility model.

What is claimed is:

1. A photovoltaic cell assembly, comprising:
   a plurality of photovoltaic cells arranged sequentially along a longitudinal direction, wherein each of the photovoltaic cells comprises a silicon wafer, a front conductive member disposed on a front surface of the silicon wafer, a first electrode and a second electrode disposed on a back surface of the silicon wafer, and a side conductive member that is disposed on a side surface of the silicon wafer and that is electrically connected between the front conductive member and a first electrode, wherein the first electrode and the second electrode of each photovoltaic cell extend along a transverse direction and are distributed at an interval in the longitudinal direction; and
   at least one conductive band, wherein the conductive band extends in the transverse direction, and is electrically connected to a first electrode and a second electrode that are adjacent to each other in the longitudinal direction and respectively located on two neighboring photovoltaic cells to conductively connect the first electrode and the second electrode located on the two neighboring photovoltaic cells, so that the two neighboring photovoltaic cells are connected in series or connected in parallel.

2. The photovoltaic cell assembly according to claim 1, wherein in the extension direction of the conductive band, an extension length of the conductive band is greater than or equal to an extension length of each first or second electrode conductively connected by the conductive band, and each of two ends of the conductive band exceeds or is flush with a corresponding end of the each first or second electrode conductively connected by the conductive band.

3. The photovoltaic cell assembly according to claim 1, wherein in the longitudinal direction of the conductive band, a span of the conductive band is greater than or equal to a sum of spans of the first electrode and the second electrode conductively connected by the conductive band, and two side edges of the conductive band respectively exceed or are flush with two side edges, away from each other, of the first electrode and the second electrode conductively connected by the conductive band.

4. The photovoltaic cell assembly according to claim 1, wherein:
   the conductive band comprises two half portions having same structures with each other and arranged sequentially perpendicular to the transverse direction of the conductive band;
   a profile line of each half portion respectively coincides with a profile line of the two adjacent first and second electrodes from two adjacent photovoltaic cells; and
   the two adjacent first and second electrodes are conductively connected by the conductive band.

5. The photovoltaic cell assembly according to claim 1, wherein in the longitudinal direction of the conductive band, a gap between the two neighboring photovoltaic cells is less than or equal to 0.1 mm.

6. The photovoltaic cell assembly according to claim 1, wherein a span of each silicon wafer in the transverse direction is from 20 mm to 60 mm.

7. The photovoltaic cell assembly according to claim 6, wherein the silicon wafer is a rectangular sheet and is formed by dividing a square regular silicon wafer body according to an unchanged length rule.

8. The photovoltaic cell assembly according to claim 6, wherein the silicon wafer is a rectangular sheet, the two first and second electrodes on each of the photovoltaic cells are respectively disposed against two long sides of the silicon wafer and extend along a transverse direction of the silicon wafer, and the side conductive member is disposed on the side surface on one long side of the silicon wafer.

9. The photovoltaic cell assembly according to claim 1, wherein in each photovoltaic cell, the first electrode electrically is connected to the side conductive member and the second electrode is not electrically connected to the side conductive member; and
   each silicon wafer comprises: a silicon substrate, a front first-type diffusion layer, and a back division layer, wherein a back surface of the silicon substrate comprises a first area and a second area, the front first-type diffusion layer is disposed on a front surface of the silicon substrate, the front conductive member is disposed on the front first-type diffusion layer, the back division layer is disposed on only and fully covers the first area, the first electrode is disposed on the back division layer, and the second electrode is disposed on the second area and is not in contact with the first electrode, wherein at least a part of the back division layer is an insulation layer configured to prevent the first electrode and the silicon substrate from being in direct contact with each other to cause short-circuit or a diffusion layer whose type is the same as that of the front first-type diffusion layer.

10. The photovoltaic cell assembly according to claim 9, wherein: in each photovoltaic cell, the silicon wafer further comprises: a side division layer, wherein the side division layer is disposed on a side surface of the silicon substrate, the side conductive member is disposed on the side division layer, and at least a part of the side division layer is an insulation layer configured to prevent the side conductive member and the second electrode from being short-circuited or a diffusion layer whose type is the same as that of the front first-type diffusion layer.

11. The photovoltaic cell assembly according to claim 9, wherein each of the photovoltaic cells further comprises:
a back electrical layer, wherein the back electrical layer is disposed on the second area, and the second electrode is disposed on the back electrical layer and is electrically connected to the back electrical layer.

12. The photovoltaic cell assembly according to claim 9, wherein each of the photovoltaic cells further comprises:
a second back gate line layer, wherein the second back gate line layer and the second electrode are both disposed on the second area, and the second electrode and the second back gate line layer are electrically connected and are not superimposed on each other in the longitudinal direction.

13. The photovoltaic cell assembly according to claim 12, wherein the silicon wafer further comprises a back second-type diffusion layer whose type is different from that of the front first-type diffusion layer, the back second-type diffusion layer is disposed on only and fully covers the second area, and the second back gate line layer and the second electrode are both disposed on the back second-type diffusion layer.

14. The photovoltaic cell assembly according to claim 9, wherein each of the photovoltaic cells further comprises:
a first back gate line layer, wherein the first back gate line layer and the first electrode are both disposed on the back division layer, and the first electrode and the first back gate line layer are electrically connected and are not superimposed on each other in the longitudinal direction.

15. The photovoltaic cell assembly according to claim 14, wherein the back division layer is a back first-type diffusion layer whose type is the same as that of the front first-type diffusion layer, the back first-type diffusion layer is disposed on only and fully covers the first area, and the first back gate line layer and the first electrode are both disposed on the back first-type diffusion layer.

16. The photovoltaic cell assembly according to claim 9, wherein each of the first area and the second area is a non-discrete area.

17. The photovoltaic cell assembly according to claim 16, wherein the first area and the second area are distributed in a fingers-crossed shape, wherein the first area comprises a first communication area and a plurality of first dispersed areas, and the plurality of first dispersed areas is spaced in a length direction of the first communication area and each is in communication with the first communication area; and the second area comprises a second communication area and a plurality of second dispersed areas, and the plurality of second dispersed areas is spaced in a length direction of the second communication area and each is in communication with the second communication area, wherein the first communication area and the second communication area are disposed in parallel, and the plurality of first dispersed areas and the plurality of second dispersed areas are alternated one by one between the first communication area and the second communication area.

18. A photovoltaic cell array, comprising:
a plurality of photovoltaic cell components connected in series, wherein:
each of the photovoltaic cell components is formed by connecting a plurality of photovoltaic cell sub-structures in parallel, wherein
each of the photovoltaic cell sub-structures is a photovoltaic cell assembly comprising:
a plurality of photovoltaic cells arranged sequentially along a longitudinal direction, wherein each of the photovoltaic cells comprises a silicon wafer, a front conductive member disposed on a front surface of the silicon wafer, a first electrode and a second electrode disposed on a back surface of the silicon wafer, and a side conductive member that is disposed on a side surface of the silicon wafer and that is electrically connected between the front conductive member and the first electrode, wherein the first electrode and the second electrode extend along a transverse direction and are distributed at an interval in the longitudinal direction; and
at least one conductive band, wherein the conductive band extends in the transverse direction, and is electrically connected to the first electrode and the second electrode that are adjacent to each other in the longitudinal direction and respectively located on two neighboring photovoltaic cells to conductively connect the two electrodes located on the two neighboring photovoltaic cells, so that the two neighboring photovoltaic cells are connected in series or connected in parallel.

19. The photovoltaic cell array according to claim 18, wherein a quantity of the photovoltaic cell components is two, and each of the photovoltaic cell components comprises three photovoltaic cell sub-structures.

20. A solar cell assembly, comprising:
a first panel, a first bonding layer, a photovoltaic cell assembly, a second bonding layer, and a second panel disposed sequentially from a front side to a back side, wherein the photovoltaic cell assembly comprising:
a plurality of photovoltaic cells arranged sequentially along a longitudinal direction, wherein each of the photovoltaic cells comprises a silicon wafer, a front conductive member disposed on a front surface of the silicon wafer, a first electrode and a second electrode disposed on a back surface of the silicon wafer, and a side conductive member that is disposed on a side surface of the silicon wafer and that is electrically connected between the front conductive member and the first electrode, wherein the first electrode and the second electrode extend along a transverse direction and are distributed at an interval in the longitudinal direction; and
at least one conductive band, wherein the conductive band extends in the transverse direction, and is electrically connected to the first electrode and the second electrode that are adjacent to each other in the longitudinal direction and respectively located on two neighboring photovoltaic cells to conductively connect the first electrode and the second electrode located on the two neighboring photovoltaic cells, so that the two neighboring photovoltaic cells are connected in series or connected in parallel.

\* \* \* \* \*